(12) United States Patent
Choi et al.

(10) Patent No.: US 7,847,392 B1
(45) Date of Patent: Dec. 7, 2010

(54) SEMICONDUCTOR DEVICE INCLUDING LEADFRAME WITH INCREASED I/O

(75) Inventors: Yeon Ho Choi, Chandler, AZ (US); GiJeong Kim, Guri-si (KR); WanJong Kim, Goyang-si (KR)

(73) Assignee: Amkor Technology, Inc., Chandler, AZ (US)

( * ) Notice: Subject to any disclaimer, the term of this patent is extended or adjusted under 35 U.S.C. 154(b) by 242 days.

(21) Appl. No.: 12/242,603

(22) Filed: Sep. 30, 2008

(51) Int. Cl.
*H01L 23/49* (2006.01)

(52) U.S. Cl. .................... 257/696; 257/782; 257/784; 257/E23.047

(58) Field of Classification Search ........... 257/E23.047
See application file for complete search history.

(56) References Cited

U.S. PATENT DOCUMENTS

| | | | |
|---|---|---|---|
| 2,596,993 A | 5/1952 | Gookin | |
| 3,435,815 A | 4/1969 | Forcier | |
| 3,734,660 A | 5/1973 | Davies et al. | |
| 3,838,984 A | 10/1974 | Crane et al. | |
| 4,054,238 A | 10/1977 | Lloyd et al. | |
| 4,189,342 A | 2/1980 | Kock | |
| 4,221,925 A | 9/1980 | Finley et al. | |
| 4,258,381 A | 3/1981 | Inaba | |
| 4,289,922 A | 9/1981 | Devlin | |
| 4,301,464 A | 11/1981 | Otsuki et al. | |
| 4,332,537 A | 6/1982 | Slepcevic | |
| 4,417,266 A | 11/1983 | Grabbe | |
| 4,451,224 A | 5/1984 | Harding | |

(Continued)

FOREIGN PATENT DOCUMENTS

DE 19734794 A1 8/1997

(Continued)

OTHER PUBLICATIONS

National Semiconductor Corporation, "Leadless Leadframe Package," Informational Pamphlet from webpage, 21 pages, Oct. 2002, www.national.com.

(Continued)

*Primary Examiner*—Stephen W Smoot
(74) *Attorney, Agent, or Firm*—Stetina Brunda Garred & Brucker

(57) ABSTRACT

In accordance with the present invention, there is provided a semiconductor package (e.g., a QFP package) including a uniquely configured leadframe sized and configured to maximize the available number of exposed leads in the semiconductor package. More particularly, the semiconductor package of the present invention includes a generally planar die pad or die paddle defining multiple peripheral edge segments. In addition, the semiconductor package includes a plurality of leads. Some of these leads include exposed bottom surface portions which are provided in at least one row or ring which at least partially circumvents the die pad, with other leads including portions which protrude from respective side surfaces of a package body of the semiconductor package. Connected to the top surface of the die pad is at least one semiconductor die which is electrically connected to at least some of the leads. At least portions of the die pad, the leads, and the semiconductor die are encapsulated by the package body, with at least portions of the bottom surfaces of the die paddle and some of the leads being exposed in a common exterior surface of the package body.

20 Claims, 15 Drawing Sheets

U.S. PATENT DOCUMENTS

| | | |
|---|---|---|
| 4,530,152 A | 7/1985 | Roche et al. |
| 4,541,003 A | 9/1985 | Otsuka et al. |
| 4,646,710 A | 3/1987 | Schmid et al. |
| 4,707,724 A | 11/1987 | Suzuki et al. |
| 4,727,633 A | 3/1988 | Herrick |
| 4,737,839 A | 4/1988 | Burt |
| 4,756,080 A | 7/1988 | Thorpe, Jr. et al. |
| 4,812,896 A | 3/1989 | Rothgery et al. |
| 4,862,245 A | 8/1989 | Pashby et al. |
| 4,862,246 A | 8/1989 | Masuda et al. |
| 4,907,067 A | 3/1990 | Derryberry |
| 4,920,074 A | 4/1990 | Shimizu et al. |
| 4,935,803 A | 6/1990 | Kalfus et al. |
| 4,942,454 A | 7/1990 | Mori et al. |
| 4,987,475 A | 1/1991 | Sclesinger et al. |
| 5,018,003 A | 5/1991 | Yasunaga |
| 5,029,386 A | 7/1991 | Chao et al. |
| 5,041,902 A | 8/1991 | McShane |
| 5,057,900 A | 10/1991 | Yamazaki |
| 5,059,379 A | 10/1991 | Tsutsumi et al. |
| 5,065,223 A | 11/1991 | Matsuki et al. |
| 5,070,039 A | 12/1991 | Johnson et al. |
| 5,087,961 A | 2/1992 | Long et al. |
| 5,091,341 A | 2/1992 | Asada et al. |
| 5,096,852 A | 3/1992 | Hobson et al. |
| 5,118,298 A | 6/1992 | Murphy |
| 5,122,860 A | 6/1992 | Kikuchi et al. |
| 5,134,773 A | 8/1992 | LeMaire et al. |
| 5,151,039 A | 9/1992 | Murphy |
| 5,157,475 A | 10/1992 | Yamaguchi |
| 5,157,480 A | 10/1992 | McShane et al. |
| 5,168,368 A | 12/1992 | Gow, 3rd et al. |
| 5,172,213 A | 12/1992 | Zimmerman |
| 5,172,214 A | 12/1992 | Casto |
| 5,175,060 A | 12/1992 | Enomoto et al. |
| 5,200,362 A | 4/1993 | Lin et al. |
| 5,200,809 A | 4/1993 | Kwon |
| 5,214,845 A | 6/1993 | King et al. |
| 5,216,278 A | 6/1993 | Lin et al. |
| 5,218,231 A | 6/1993 | Kudo |
| 5,221,642 A | 6/1993 | Burns |
| 5,250,841 A | 10/1993 | Sloan et al. |
| 5,252,853 A | 10/1993 | Michii |
| 5,258,094 A | 11/1993 | Furui et al. |
| 5,266,834 A | 11/1993 | Nishi et al. |
| 5,273,938 A | 12/1993 | Lin et al. |
| 5,277,972 A | 1/1994 | Sakumoto et al. |
| 5,278,446 A | 1/1994 | Nagaraj et al. |
| 5,279,029 A | 1/1994 | Burns |
| 5,281,849 A | 1/1994 | Singh Deo et al. |
| 5,285,352 A | 2/1994 | Pastore et al. |
| 5,294,897 A | 3/1994 | Notani et al. |
| 5,327,008 A | 7/1994 | Djennas et al. |
| 5,332,864 A | 7/1994 | Liang et al. |
| 5,335,771 A | 8/1994 | Murphy |
| 5,336,931 A | 8/1994 | Juskey et al. |
| 5,343,076 A | 8/1994 | Katayama et al. |
| 5,358,905 A | 10/1994 | Chiu |
| 5,365,106 A | 11/1994 | Watanabe |
| 5,381,042 A | 1/1995 | Lerner et al. |
| 5,391,439 A | 2/1995 | Tomita et al. |
| 5,406,124 A | 4/1995 | Morita et al. |
| 5,410,180 A | 4/1995 | Fujii et al. |
| 5,414,299 A | 5/1995 | Wang et al. |
| 5,417,905 A | 5/1995 | LeMaire et al. |
| 5,424,576 A | 6/1995 | Djennas et al. |
| 5,428,248 A | 6/1995 | Cha |
| 5,435,057 A | 7/1995 | Bindra et al. |
| 5,444,301 A | 8/1995 | Song et al. |
| 5,452,511 A | 9/1995 | Chang |
| 5,454,905 A | 10/1995 | Fogelson |
| 5,467,032 A | 11/1995 | Lee |
| 5,474,958 A | 12/1995 | Djennas et al. |
| 5,484,274 A | 1/1996 | Neu |
| 5,493,151 A | 2/1996 | Asada et al. |
| 5,508,556 A | 4/1996 | Lin |
| 5,517,056 A | 5/1996 | Bigler et al. |
| 5,521,429 A | 5/1996 | Aono et al. |
| 5,528,076 A | 6/1996 | Pavio |
| 5,534,467 A | 7/1996 | Rostoker |
| 5,539,251 A | 7/1996 | Iverson et al. |
| 5,543,657 A | 8/1996 | Diffenderfer et al. |
| 5,544,412 A | 8/1996 | Romero et al. |
| 5,545,923 A | 8/1996 | Barber |
| 5,581,122 A | 12/1996 | Chao et al. |
| 5,592,019 A | 1/1997 | Ueda et al. |
| 5,592,025 A | 1/1997 | Clark et al. |
| 5,594,274 A | 1/1997 | Suetaki |
| 5,595,934 A | 1/1997 | Kim |
| 5,604,376 A | 2/1997 | Hamburgen et al. |
| 5,608,265 A | 3/1997 | Kitano et al. |
| 5,608,267 A | 3/1997 | Mahulikar et al. |
| 5,625,222 A | 4/1997 | Yoneda et al. |
| 5,633,528 A | 5/1997 | Abbott et al. |
| 5,637,922 A | 6/1997 | Fillion et al. |
| 5,639,990 A | 6/1997 | Nishihara et al. |
| 5,640,047 A | 6/1997 | Nakashima |
| 5,641,997 A | 6/1997 | Ohta et al. |
| 5,643,433 A | 7/1997 | Fukase et al. |
| 5,644,169 A | 7/1997 | Chun |
| 5,646,831 A | 7/1997 | Manteghi |
| 5,650,663 A | 7/1997 | Parthasarathi |
| 5,661,088 A | 8/1997 | Tessier et al. |
| 5,665,996 A | 9/1997 | Williams et al. |
| 5,673,479 A | 10/1997 | Hawthorne |
| 5,683,806 A | 11/1997 | Sakumoto et al. |
| 5,683,943 A | 11/1997 | Yamada |
| 5,689,135 A | 11/1997 | Ball |
| 5,696,666 A | 12/1997 | Miles et al. |
| 5,701,034 A | 12/1997 | Marrs |
| 5,703,407 A | 12/1997 | Hori |
| 5,710,064 A | 1/1998 | Song et al. |
| 5,723,899 A | 3/1998 | Shin |
| 5,724,233 A | 3/1998 | Honda et al. |
| 5,726,493 A | 3/1998 | Yamashita |
| 5,736,432 A | 4/1998 | Mackessy |
| 5,745,984 A | 5/1998 | Cole, Jr. et al. |
| 5,753,532 A | 5/1998 | Sim |
| 5,753,977 A | 5/1998 | Kusaka et al. |
| 5,766,972 A | 6/1998 | Takahashi et al. |
| 5,767,566 A | 6/1998 | Suda |
| 5,770,888 A | 6/1998 | Song et al. |
| 5,776,798 A | 7/1998 | Quan et al. |
| 5,783,861 A | 7/1998 | Son |
| 5,801,440 A | 9/1998 | Chu et al. |
| 5,814,877 A | 9/1998 | Diffenderfer et al. |
| 5,814,881 A | 9/1998 | Alagaratnam et al. |
| 5,814,883 A | 9/1998 | Sawai et al. |
| 5,814,884 A | 9/1998 | Davies et al. |
| 5,817,540 A | 10/1998 | Wark |
| 5,818,105 A | 10/1998 | Kouda |
| 5,821,457 A | 10/1998 | Mosley et al. |
| 5,821,615 A | 10/1998 | Lee |
| 5,834,830 A | 11/1998 | Cho |
| 5,835,988 A | 11/1998 | Ishii |
| 5,844,306 A | 12/1998 | Fujita et al. |
| 5,854,511 A | 12/1998 | Shin et al. |
| 5,854,512 A | 12/1998 | Manteghi |
| 5,856,911 A | 1/1999 | Riley |
| 5,859,471 A | 1/1999 | Kuraishi et al. |
| 5,866,939 A | 2/1999 | Shin et al. |
| 5,866,942 A | 2/1999 | Suzuki et al. |
| 5,871,782 A | 2/1999 | Choi |
| 5,874,784 A | 2/1999 | Aoki et al. |

| | | | | | | | |
|---|---|---|---|---|---|---|---|
| 5,877,043 | A | 3/1999 | Alcoe et al. | 6,384,472 | B1 | 5/2002 | Huang |
| 5,886,397 | A | 3/1999 | Ewer | 6,388,336 | B1 | 5/2002 | Venkateshwaran et al. |
| 5,973,935 | A | 10/1999 | Schoenfeld et al. | 6,395,578 | B1 | 5/2002 | Shin et al. |
| 5,977,630 | A | 11/1999 | Woodworth et al. | 6,399,415 | B1 | 6/2002 | Bayan et al. |
| RE036,773 | E | 7/2000 | Nomi et al. | 6,400,004 | B1 | 6/2002 | Fan et al. |
| 6,107,679 | A | 8/2000 | Noguchi | 6,410,979 | B2 | 6/2002 | Abe |
| 6,143,981 | A | 11/2000 | Glenn | 6,414,385 | B1 | 7/2002 | Huang et al. |
| 6,150,709 | A | 11/2000 | Shin et al. | 6,420,779 | B1 | 7/2002 | Sharma et al. |
| 6,157,074 | A | 12/2000 | Lee | 6,421,013 | B1 | 7/2002 | Chung |
| 6,166,430 | A | 12/2000 | Yamaguchi | 6,423,643 | B1 | 7/2002 | Furuhata et al. |
| 6,169,329 | B1 | 1/2001 | Farnworth et al. | 6,429,508 | B1 | 8/2002 | Gang |
| 6,177,718 | B1 | 1/2001 | Kozono | 6,437,429 | B1 | 8/2002 | Su et al. |
| 6,181,002 | B1 | 1/2001 | Juso et al. | 6,444,499 | B1 | 9/2002 | Swiss et al. |
| 6,184,465 | B1 | 2/2001 | Corisis | 6,448,633 | B1 | 9/2002 | Yee et al. |
| 6,184,573 | B1 | 2/2001 | Pu | 6,452,279 | B2 | 9/2002 | Shimoda |
| 6,194,777 | B1 | 2/2001 | Abbott et al. | 6,459,148 | B1 | 10/2002 | Chun-Jen et al. |
| 6,197,615 | B1 | 3/2001 | Song et al. | 6,464,121 | B2 | 10/2002 | Reijinders |
| 6,198,171 | B1 | 3/2001 | Huang et al. | 6,465,883 | B2 | 10/2002 | Oloffson |
| 6,201,186 | B1 | 3/2001 | Daniels et al. | 6,472,735 | B2 | 10/2002 | Isaak |
| 6,201,292 | B1 | 3/2001 | Yagi et al. | 6,475,646 | B2 | 11/2002 | Park et al. |
| 6,204,554 | B1 | 3/2001 | Ewer et al. | 6,476,469 | B2 | 11/2002 | Hung et al. |
| 6,208,020 | B1 | 3/2001 | Minamio et al. | 6,476,474 | B1 | 11/2002 | Hung |
| 6,208,021 | B1 | 3/2001 | Ohuchi et al. | 6,482,680 | B1 | 11/2002 | Khor et al. |
| 6,208,023 | B1 | 3/2001 | Nakayama et al. | 6,483,178 | B1 | 11/2002 | Chuang |
| 6,211,462 | B1 | 4/2001 | Carter, Jr. et al. | 6,492,718 | B2 | 12/2002 | Ohmori |
| 6,218,731 | B1 | 4/2001 | Huang et al. | 6,495,909 | B2 | 12/2002 | Jung et al. |
| 6,222,258 | B1 | 4/2001 | Asano et al. | 6,498,099 | B1 | 12/2002 | McClellan et al. |
| 6,222,259 | B1 | 4/2001 | Park et al. | 6,498,392 | B2 | 12/2002 | Azuma |
| 6,225,146 | B1 | 5/2001 | Yamaguchi et al. | 6,507,096 | B2 | 1/2003 | Gang |
| 6,229,200 | B1 | 5/2001 | McClellan et al. | 6,507,120 | B2 | 1/2003 | Lo et al. |
| 6,229,205 | B1 | 5/2001 | Jeong et al. | 6,518,089 | B2 | 2/2003 | Coyle |
| 6,238,952 | B1 | 5/2001 | Lin et al. | 6,525,942 | B2 | 2/2003 | Huang et al. |
| 6,239,367 | B1 | 5/2001 | Hsuan et al. | 6,528,893 | B2 | 3/2003 | Jung et al. |
| 6,239,384 | B1 | 5/2001 | Smith et al. | 6,534,849 | B1 | 3/2003 | Gang |
| 6,242,281 | B1 | 6/2001 | McClellan et al. | 6,545,332 | B2 | 4/2003 | Huang |
| 6,256,200 | B1 | 7/2001 | Lam et al. | 6,545,345 | B1 | 4/2003 | Glenn et al. |
| 6,258,629 | B1 | 7/2001 | Niones et al. | 6,552,421 | B2 | 4/2003 | Kishimoto et al. |
| 6,261,864 | B1 | 7/2001 | Jung et al. | 6,559,525 | B2 | 5/2003 | Huang |
| 6,281,566 | B1 | 8/2001 | Magni | 6,566,168 | B2 | 5/2003 | Gang |
| 6,282,094 | B1 | 8/2001 | Lo et al. | 6,580,161 | B2 | 6/2003 | Kobayakawa |
| 6,282,095 | B1 | 8/2001 | Houghton et al. | 6,583,503 | B2 | 6/2003 | Akram et al. |
| 6,285,075 | B1 | 9/2001 | Combs et al. | 6,585,905 | B1 | 7/2003 | Fan et al. |
| 6,291,271 | B1 | 9/2001 | Lee et al. | 6,603,196 | B2 | 8/2003 | Lee et al. |
| 6,291,273 | B1 | 9/2001 | Miyaki et al. | 6,624,005 | B1 | 9/2003 | DiCaprio et al. |
| 6,294,100 | B1 | 9/2001 | Fan et al. | 6,627,977 | B1 | 9/2003 | Foster |
| 6,294,830 | B1 | 9/2001 | Fjelstad | 6,646,339 | B1 | 11/2003 | Ku |
| 6,295,977 | B1 | 10/2001 | Ripper et al. | 6,667,546 | B2 | 12/2003 | Huang et al. |
| 6,297,548 | B1 | 10/2001 | Moden et al. | 6,677,663 | B1 | 1/2004 | Ku et al. |
| 6,303,984 | B1 | 10/2001 | Corisis | 6,686,649 | B1 | 2/2004 | Matthews et al. |
| 6,303,997 | B1 | 10/2001 | Lee | 6,696,752 | B2 | 2/2004 | Su et al. |
| 6,306,685 | B1 | 10/2001 | Liu et al. | 6,700,189 | B2 | 3/2004 | Shibata |
| 6,307,272 | B1 | 10/2001 | Takahashi et al. | 6,713,375 | B2 | 3/2004 | Shenoy |
| 6,309,909 | B1 | 10/2001 | Ohgiyama | 6,757,178 | B2 | 6/2004 | Okabe et al. |
| 6,316,822 | B1 | 11/2001 | Venkateshwaran et al. | 6,800,936 | B2 | 10/2004 | Kosemura et al. |
| 6,316,838 | B1 | 11/2001 | Ozawa et al. | 6,812,552 | B2 | 11/2004 | Islam et al. |
| 6,323,550 | B1 | 11/2001 | Martin et al. | 6,818,973 | B1 | 11/2004 | Foster |
| 6,326,243 | B1 | 12/2001 | Suzuya et al. | 6,858,919 | B2 | 2/2005 | Seo et al. |
| 6,326,244 | B1 | 12/2001 | Brooks et al. | 6,867,492 | B2 | 3/2005 | Auburger et al. |
| 6,326,678 | B1 | 12/2001 | Karnezos et al. | 6,876,068 | B1 | 4/2005 | Lee et al. |
| 6,335,564 | B1 | 1/2002 | Pour | 6,878,571 | B2 | 4/2005 | Isaak et al. |
| 6,337,510 | B1 | 1/2002 | Chun-Jen et al. | 6,897,552 | B2 | 5/2005 | Nakao |
| 6,339,252 | B1 | 1/2002 | Niones et al. | 6,927,478 | B2 | 8/2005 | Paek |
| 6,339,255 | B1 | 1/2002 | Shin | 6,967,125 | B2 | 11/2005 | Fee et al. |
| 6,342,730 | B1 | 1/2002 | Jung et al. | 6,995,459 | B2 | 2/2006 | Lee et al. |
| 6,348,726 | B1 | 2/2002 | Bayan et al. | 7,002,805 | B2 | 2/2006 | Lee et al. |
| 6,355,502 | B1 | 3/2002 | Kang et al. | 7,005,327 | B2 | 2/2006 | Kung et al. |
| 6,359,221 | B1 | 3/2002 | Yamada et al. | 7,015,571 | B2 | 3/2006 | Chang et al. |
| 6,362,525 | B1 | 3/2002 | Rahim | 7,045,396 | B2 | 5/2006 | Crowley et al. |
| 6,369,447 | B2 | 4/2002 | Mori | 7,053,469 | B2 | 5/2006 | Koh et al. |
| 6,369,454 | B1 | 4/2002 | Chung | 7,075,816 | B2 | 7/2006 | Fee et al. |
| 6,373,127 | B1 | 4/2002 | Baudouin et al. | 7,102,209 | B1 | 9/2006 | Bayan et al. |
| 6,377,464 | B1 | 4/2002 | Hashemi et al. | 7,109,572 | B2 | 9/2006 | Fee et al. |
| 6,380,048 | B1 | 4/2002 | Boon et al. | 7,185,426 | B1 | 3/2007 | Hiner et al. |

| | | | | | | |
|---|---|---|---|---|---|---|
| 7,193,298 | B2 | 3/2007 | Hong et al. | JP | 63205935 | 8/1988 |
| 7,211,471 | B1 | 5/2007 | Foster | JP | 63233555 | 9/1988 |
| 7,245,007 | B1 | 7/2007 | Foster | JP | 63249345 | 10/1988 |
| 7,253,503 | B1 | 8/2007 | Fusaro et al. | JP | 63289951 | 11/1988 |
| 2001/0008305 | A1 | 7/2001 | McClellan et al. | JP | 63316470 | 12/1988 |
| 2001/0014538 | A1 | 8/2001 | Kwan et al. | JP | 64054749 | 3/1989 |
| 2002/0011654 | A1 | 1/2002 | Kimura | JP | 1106456 | 4/1989 |
| 2002/0024122 | A1 | 2/2002 | Jung et al. | JP | 1175250 | 7/1989 |
| 2002/0027297 | A1 | 3/2002 | Ikenaga et al. | JP | 1205544 | 8/1989 |
| 2002/0038873 | A1 | 4/2002 | Hiyoshi | JP | 1251747 | 10/1989 |
| 2002/0072147 | A1 | 6/2002 | Sayanagi et al. | JP | 2129948 | 5/1990 |
| 2002/0111009 | A1 | 8/2002 | Huang et al. | JP | 369248 | 7/1991 |
| 2002/0140061 | A1 | 10/2002 | Lee | JP | 3177060 | 8/1991 |
| 2002/0140068 | A1 | 10/2002 | Lee et al. | JP | 3289162 | 12/1991 |
| 2002/0140081 | A1 | 10/2002 | Chou et al. | JP | 4098864 | 3/1992 |
| 2002/0158318 | A1 | 10/2002 | Chen | JP | 5129473 | 5/1993 |
| 2002/0163015 | A1 | 11/2002 | Lee et al. | JP | 5166992 | 7/1993 |
| 2002/0167060 | A1 | 11/2002 | Buijsman et al. | JP | 5283460 | 10/1993 |
| 2003/0006055 | A1 | 1/2003 | Chien-Hung et al. | JP | 6061401 | 3/1994 |
| 2003/0030131 | A1 | 2/2003 | Lee et al. | JP | 692076 | 4/1994 |
| 2003/0059644 | A1 | 3/2003 | Datta et al. | JP | 6140563 | 5/1994 |
| 2003/0064548 | A1 | 4/2003 | Isaak | JP | 652333 | 9/1994 |
| 2003/0073265 | A1 | 4/2003 | Hu et al. | JP | 6252333 | 9/1994 |
| 2003/0102537 | A1 | 6/2003 | McLellan et al. | JP | 6260532 | 9/1994 |
| 2003/0164554 | A1 | 9/2003 | Fee et al. | JP | 7297344 | 11/1995 |
| 2003/0168719 | A1 | 9/2003 | Cheng et al. | JP | 7312405 | 11/1995 |
| 2003/0198032 | A1 | 10/2003 | Collander et al. | JP | 8064634 | 3/1996 |
| 2004/0027788 | A1 | 2/2004 | Chiu et al. | JP | 8083877 | 3/1996 |
| 2004/0056277 | A1 | 3/2004 | Karnezos | JP | 8125066 | 5/1996 |
| 2004/0061212 | A1 | 4/2004 | Karnezos | JP | 964284 | 6/1996 |
| 2004/0061213 | A1 | 4/2004 | Karnezos | JP | 8222682 | 8/1996 |
| 2004/0063242 | A1 | 4/2004 | Karnezos | JP | 8306853 | 11/1996 |
| 2004/0063246 | A1 | 4/2004 | Karnezos | JP | 98205 | 1/1997 |
| 2004/0065963 | A1 | 4/2004 | Karnezos | JP | 98206 | 1/1997 |
| 2004/0080025 | A1 | 4/2004 | Kasahara et al. | JP | 98207 | 1/1997 |
| 2004/0089926 | A1 | 5/2004 | Hsu et al. | JP | 992775 | 4/1997 |
| 2004/0097016 | A1 | 5/2004 | Yee et al. | JP | 9260568 | 10/1997 |
| 2004/0164387 | A1 | 8/2004 | Ikenaga et al. | JP | 9293822 | 11/1997 |
| 2004/0253803 | A1 | 12/2004 | Tomono et al. | JP | 10022447 | 1/1998 |
| 2005/0199987 | A1 | 9/2005 | Danno et al. | JP | 10199934 | 7/1998 |
| 2006/0087020 | A1 | 4/2006 | Hirano et al. | JP | 10256240 | 9/1998 |
| 2006/0157843 | A1 | 7/2006 | Hwang | JP | 11307675 | 11/1999 |
| 2006/0231939 | A1 | 10/2006 | Kawabata et al. | JP | 2000150765 | 5/2000 |
| 2007/0023202 | A1 | 2/2007 | Shibata | JP | 2001060648 | 3/2001 |
| 2008/0036051 | A1* | 2/2008 | Espiritu et al. .............. 257/666 | JP | 2002519848 | 7/2002 |
| | | | | JP | 2002043497 | 8/2002 |

FOREIGN PATENT DOCUMENTS

| | | |
|---|---|---|
| EP | 0393997 | 10/1990 |
| EP | 0459493 | 12/1991 |
| EP | 0720225 | 3/1996 |
| EP | 0720234 | 3/1996 |
| EP | 0794572 A2 | 10/1997 |
| EP | 0844665 | 5/1998 |
| EP | 0936671 | 8/1999 |
| EP | 0989608 | 3/2000 |
| EP | 1032037 | 8/2000 |
| JP | 55163868 | 12/1980 |
| JP | 5745959 | 3/1982 |
| JP | 58160096 | 8/1983 |
| JP | 59208756 | 11/1984 |
| JP | 59227143 | 12/1984 |
| JP | 60010756 | 1/1985 |
| JP | 60116239 | 8/1985 |
| JP | 60195957 | 10/1985 |
| JP | 60231349 | 11/1985 |
| JP | 6139555 | 2/1986 |
| JP | 61248541 | 11/1986 |
| JP | 629639 | 1/1987 |
| JP | 6333854 | 2/1988 |
| JP | 63067762 | 3/1988 |
| JP | 63188964 | 8/1988 |
| KR | 941979 | 1/1994 |
| KR | 19940010938 | 5/1994 |
| KR | 19950018924 | 6/1995 |
| KR | 19950041844 | 11/1995 |
| KR | 19950044554 | 11/1995 |
| KR | 19950052621 | 12/1995 |
| KR | 1996074111 | 12/1996 |
| KR | 9772358 | 11/1997 |
| KR | 100220154 | 6/1999 |
| KR | 20000072714 | 12/2000 |
| KR | 20000086238 | 12/2000 |
| KR | 20020049944 | 6/2002 |
| WO | 9956316 | 11/1999 |
| WO | 9967821 | 12/1999 |

OTHER PUBLICATIONS

Vishay, "4 Milliohms in the So-8: Vishay Siliconix Sets New Record for Power MOSFET On-Resistance," Press Release from webpage, 3 pages, www.vishay.com/news/releases, Nov. 7, 2002.

Patrick Mannion, "MOSFETs Break out of the Shackles of Wire Bonding," Informational Packet, 5 pages, Electronic Design, Mar. 22, 1999 vol. 47, No. 6, www.elecdesign.com/1999/mar2299/ti/0322ti1.shtml.

* cited by examiner

SEMICONDUCTOR DEVICE INCLUDING LEADFRAME WITH INCREASED I/O

CROSS-REFERENCE TO RELATED APPLICATIONS

Not Applicable

STATEMENT RE: FEDERALLY SPONSORED RESEARCH/DEVELOPMENT

Not Applicable

BACKGROUND OF THE INVENTION

1. Field of the Invention

The present invention relates generally to integrated circuit package technology and, more particularly, to an increased capacity QFP semiconductor package which includes exposed leads and an exposed die pad on the bottom surface of the package body thereof, and additional leads which protrude from side surfaces of the package body.

2. Description of the Related Art

Semiconductor dies are conventionally enclosed in plastic packages that provide protection from hostile environments and enable electrical interconnection between the semiconductor die and an underlying substrate such as a printed circuit board (PCB) or motherboard. The elements of such a package include a metal leadframe, an integrated circuit or semiconductor die, bonding material to attach the semiconductor die to the leadframe, bond wires which electrically connect pads on the semiconductor die to individual leads of the leadframe, and a hard plastic encapsulant material which covers the other components and forms the exterior of the semiconductor package commonly referred to as the package body.

The leadframe is the central supporting structure of such a package, and is typically fabricated by chemically etching or mechanically stamping a metal strip. A portion of the leadframe is internal to the package, i.e., completely surrounded by the plastic encapsulant or package body. Portions of the leads of the leadframe extend externally from the package body or are partially exposed therein for use in electrically connecting the package to another component. In certain semiconductor packages, a portion of the die pad of the leadframe also remains exposed within the package body.

Leadframes for semiconductor packages can be largely classified into copper-based leadframes (copper/iron/phosphorous; 99.8/0.01/0.025), copper alloy-based leadframes (copper/chromium/tin/zinc; 99.0/0.25/0.22), alloy 42-based leadframes (iron/nickel; 58.0/42.0), etc. according to the composition of the elements or materials included in the leadframe. Exemplary semiconductor packages or devices employing leadframes include a through-hole mounting dual type inline package (DIP), a surface mounting type quad flat package (QFP), and a small outline package (SOP).

As indicated above, one type of semiconductor package commonly including a leadframe is a quad flat pack (QFP) package. QFP semiconductor packages or devices are particularly advantageous for their smaller size and superior electrical performance. A typical QFP package comprises a thin, generally square package body defining four peripheral sides of substantially equal length. Protruding from each of the four peripheral sides of the package body are a plurality of leads which each have a generally gull-wing configuration. Portions of the leads are internal to the package body, and are electrically connected to respective ones of the pads or terminals of a semiconductor die also encapsulated within the package body. The semiconductor die is itself mounted to a die pad of the QFP package leadframe. In certain types of QFP packages referred to as QFP exposed pad packages, one surface of the die pad is exposed within the bottom surface of the package body.

In the electronics industry and, in particular, in high frequency applications such hard disk drives, digital television and other consumer electronics, there is an increasing need for QFP exposed pad packages of increased functional capacity, coupled with reduced size. One of the deficiencies of currently known QFP packages is attributable to the length at which the leads protrude from the sides of the package body, such protrusion length resulting in an increase in the overall size of the QFP package and further limiting the number of inputs/outputs (I/O's) which may be included therein. With recent trends toward high integration and high performance semiconductor dies, there is a need for QFP packages to have a larger number of I/O's with excellent thermal and electrical properties. In view of this need, conventional leadframe structures as currently known and integrated into existing QFP packages often prove to be unsatisfactory.

In an attempt to address some of the deficiencies highlighted above in relation to QFP packages, there has been developed in the prior art ball grid array (BGA) and pin grid array (PGA) semiconductor packages or devices which employ the use of laminate, tape, or film circuit boards as opposed to leadframes. These particular types of semiconductor packages provide a relatively large number of I/O's, such I/O's being defined by solder balls or metal pins which are formed on a lower surface of the encapsulant or package body of the package, rather than on the side surfaces of the package body. However, the circuit boards integrated into these types of semiconductor packages are expensive and typically exhibit poor heat sink and electrical performance characteristics in comparison to semiconductor packages employing leadframes. In this regard, semiconductor packages or devices employing leadframes often exhibit good heat sink performance due to the semiconductor die being directly mounted on a metal (e.g., copper) die pad of the leadframe. Further, the die pad of the leadframe can be used as a ground area to improve the electrical properties of the semiconductor package. Such a structure is difficult to achieve in a semiconductor package employing a circuit board.

The present invention provides a QFP exposed pad package which addresses the aforementioned needs by providing increased I/O with a reduced overall size. The QFP package of the present invention includes exposed leads and an exposed die pad on the bottom surface of the package body thereof, and additional leads which protrude from side surfaces of the package body. The QFP package of the present invention is also provided through the use of standard, low-cost leadframe design techniques. These, as well as other features and attributes of the present invention will be discussed in more detail below.

BRIEF SUMMARY OF THE INVENTION

In accordance with the present invention, there is provided a semiconductor package (e.g., a QFP package) including a uniquely configured leadframe sized and configured to maximize the available number of exposed leads in the semiconductor package. More particularly, the semiconductor package of the present invention includes a generally planar die pad or die paddle defining multiple peripheral edge segments. In addition, the semiconductor package includes a plurality of leads. Some of these leads include exposed bottom surface portions which are provided in at least one row or ring which at least partially circumvents the die pad, with other leads including portions which protrude from respective side surfaces of a package body of the semiconductor package. Connected to the top surface of the die pad is at least one semiconductor die which is electrically connected to at least some of the leads. At least portions of the die pad, the leads, and the semiconductor die are encapsulated by the package body, with at least portions of the bottom surfaces of the die paddle and some of the leads being exposed in a common exterior surface of the package body. The leadframe of the semiconductor package is fabricated in accordance with standard, low-cost forming techniques. In accordance with the present invention, sawing, punching, etching, or other material removal processes may be completed during the fabrication of the semiconductor package to effectively electrically isolate various leads from each other within the semiconductor package. The semiconductor package of the present invention may include one or more internal semiconductor dies, depending on functional requirements.

The present invention is best understood by reference to the following detailed description when read in conjunction with the accompanying drawings.

BRIEF DESCRIPTION OF THE DRAWINGS

These, as well as other features of the present invention, will become more apparent upon reference to the drawings wherein.

Common reference numerals are used throughout the drawings and detailed description to indicate like elements.

DETAILED DESCRIPTION OF THE INVENTION

Figure 1A:
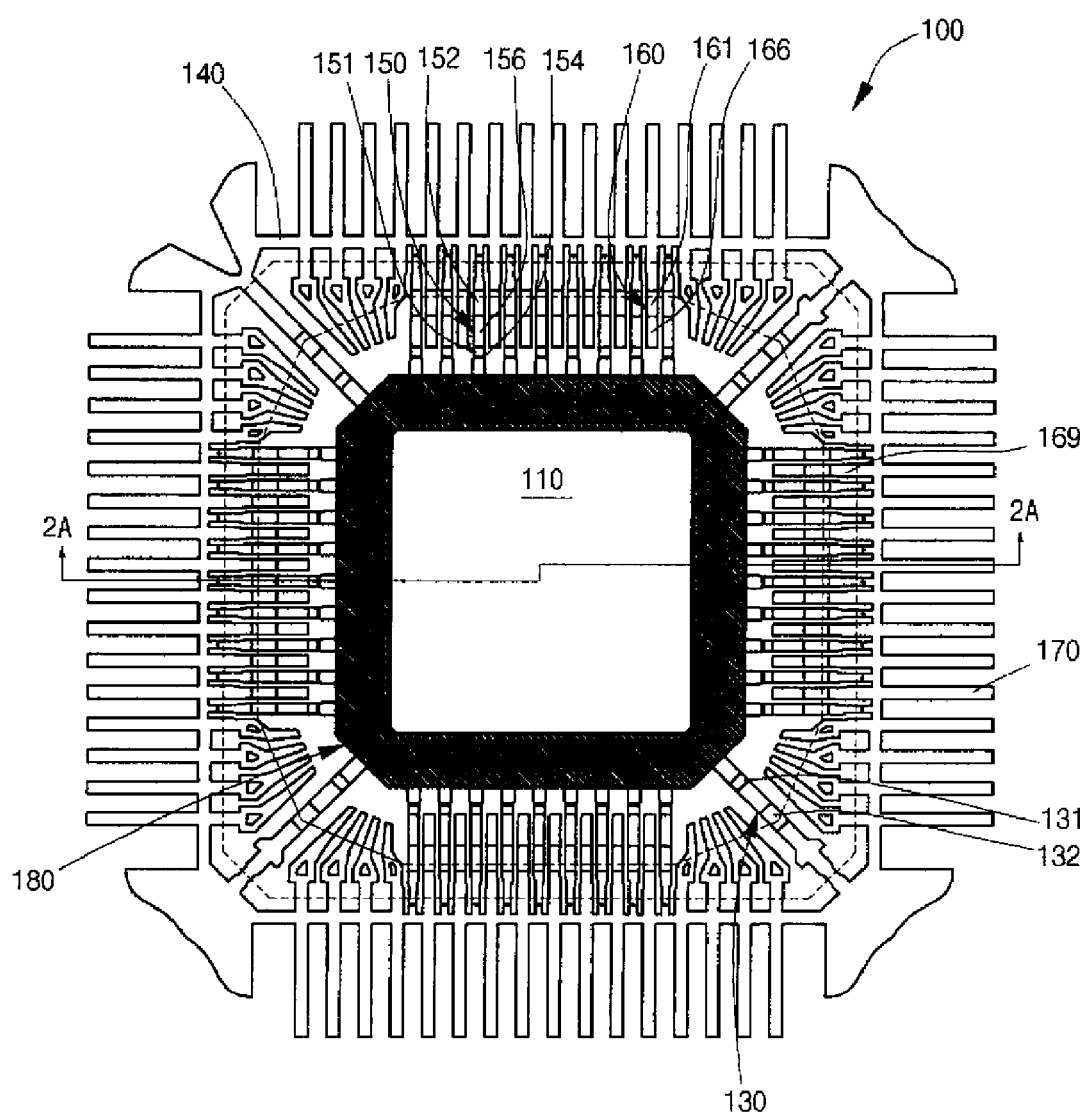
FIG. 1A is a top plan view of an unsingulated leadframe which is integrated into a semiconductor package constructed in accordance with the present invention, further depicting a tape layer which may be applied to the leadframe.

Referring now to the drawings wherein the showings are for purposes of illustrating one embodiment of the present invention only, and not for purposes of limiting the same, FIGS. 1A-3 depict a leadframe 100 for integration into a semiconductor package 200 constructed in accordance with the present invention. The semiconductor package 200 is shown in FIGS. 4A-4C.

Referring now to FIGS. 1A-3, the leadframe 100 of the present invention comprises a generally quadrangular (e.g., square) die pad 110 which defines four peripheral edge segments. Protruding laterally from each of the four peripheral edge segments of the die pad 110 is a plurality of pads 120 which are each integrally connected to the die pad 110. Thus, as best seen in FIG. 1B, the pads 120 are segregated into four sets, with each set of the pads 120 protruding outwardly from a respective one of the peripheral edge segments defined by the die pad 110. In the leadframe 100, the pads 120 of each set are arranged at a predetermined pitch and protrude outwardly at a predetermined length from a respective one of the peripheral edge segments of the die pad 110. As is also apparent from FIG. 1B, the pads 120 of each set thereof extend generally perpendicularly relative to a corresponding peripheral edge segment of the die pad 110. The pads 120 are used for purposes which will be described in more detail below.

Figure 1B:
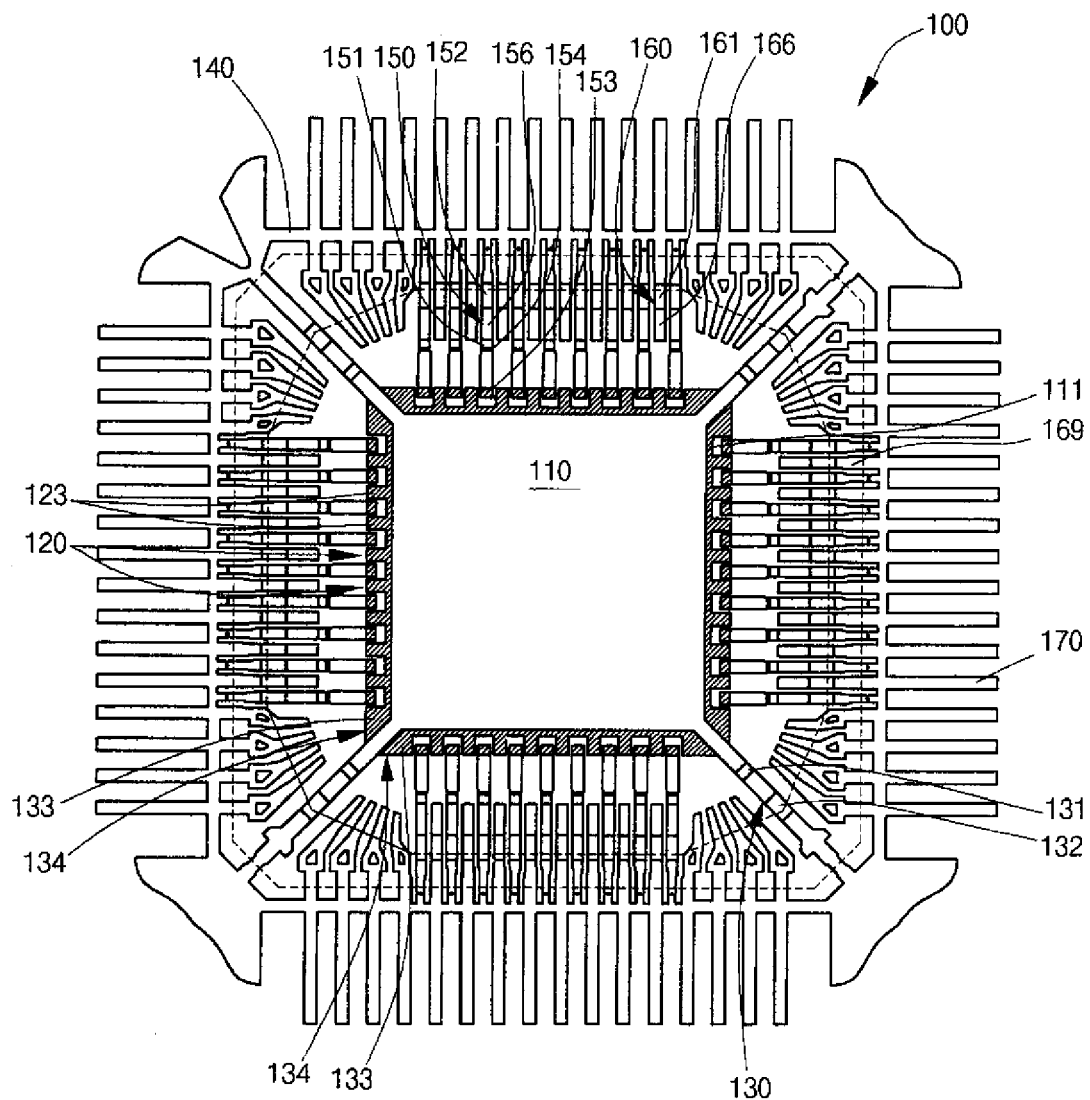
FIG. 1B is a bottom plan view of the leadframe shown in FIG. 1.

As best seen in FIG. 1B, the die pad 110 of the leadframe 100 is not of uniform thickness. Rather, formed in a peripheral portion of the bottom surface of the die pad 110 is a half-etched portion 111. More particularly, the half-etched portion 111 is segregated into four segments, with each of these segments extending along a respective one of peripheral edge segments of the die pad 110 and between a respective pair of tie bars 130 which are described in more detail below. The half-etched portion 111 of the die pad 110 is indicated by the hatching shown in FIG. 1B. As will be discussed in more detail below, in the fabrication process for the semiconductor package 200 including the leadfame 100, a semiconductor die is attached to the top surface of the die pad 110 through the use of an adhesive layer, with an encapsulant material thereafter being applied to the semiconductor die and the leadframe 100 to form the package body of the semiconductor package 200. Advantageously, the half-etched portion 111 formed in the peripheral portion of the bottom surface of the die pad 110 as indicated above effectively increases the distance along which moisture must travel to reach the semiconductor die mounted to the top surface of the die pad 110. As a result, such semiconductor die is safely protected against moisture in the completed semiconductor package 200. Additionally, the flow of encapsulant material over the half-etched portion 111 during the formation of the package body of the semiconductor package 200 facilitates the creation of a mechanical interlock between the package body and the die pad 110.

In addition to the die pad 110 including the half-etched portion 111 described above, each of the pads 120 protruding from respective peripheral edge segments of the die pad 110 includes a half etched portion 123 which defines the bottom surface thereof. During the fabrication process for the semiconductor package 200 including the leadframe 100, the encapsulant material used to form the package body of the semiconductor package 200 is able to flow over the half-etched portions 123 of the protruding pads 120, thus resulting in the pads 120 being encapsulated by the package body of the semiconductor package 200 which improves the bonding or mechanical interlock therebetween. The half-etched portions 123 of the pads 120 are also indicated by the hatching shown in FIG. 1B. Additionally, the half-etched portions 123 of the pads 120 extend in generally coplanar relation to the half-etched portion 111 of the die pad 110.

In addition to the pads 120, also integrally connected to the die pad 110 are a plurality of tie bars 130. More particularly, the leadframe 100 includes four tie bars 130 which extend diagonally from respective ones of the four corner regions defined by the die pad 110. As seen in FIGS. 1A and 1B, the tie bars 130 are integrally connected to a generally quadrangular dambar 140 which circumvents the die pad 110 and is disposed in spaced relation thereto. Additionally, each of the tie bars 130 is bent to include a first downset 131 and a second downset 132. The first downset 131 of each tie bar 130 is disposed between the second downset 132 and the die pad 110. Due to the inclusion of the first and second downsets 131, 132 therein, each of the tie bars 130 includes a first segment which is disposed between the die pad 110 and the first downset 131 and extends in generally co-planar relation to the die pad 110, a second segment which extends between the first and second downsets 131, 132 and resides on a plane which is elevated above that of the die pad 110, and a third segment which extends between the second downset 132 and the dambar 140 and resides on a plane which is elevated above that of the second segment. Thus, the first, second and third segments of each tie bar 130 reside on respective ones of three spaced, generally parallel planes, with the plane upon which the second segment resides being disposed between those planes on which respective ones of the first and third segments reside.

Figure 3:
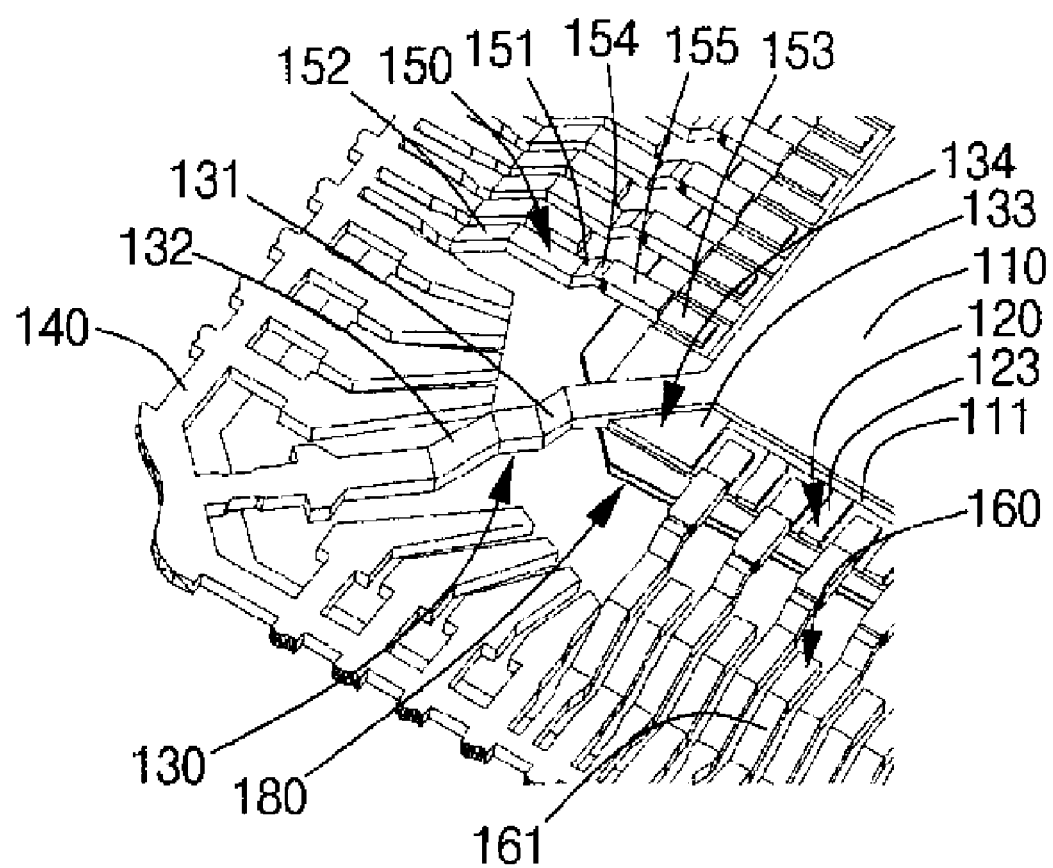
FIG. 3 is a partial bottom perspective view of the leadframe shown in FIGS. 1A and 1B.
Figure 4A:
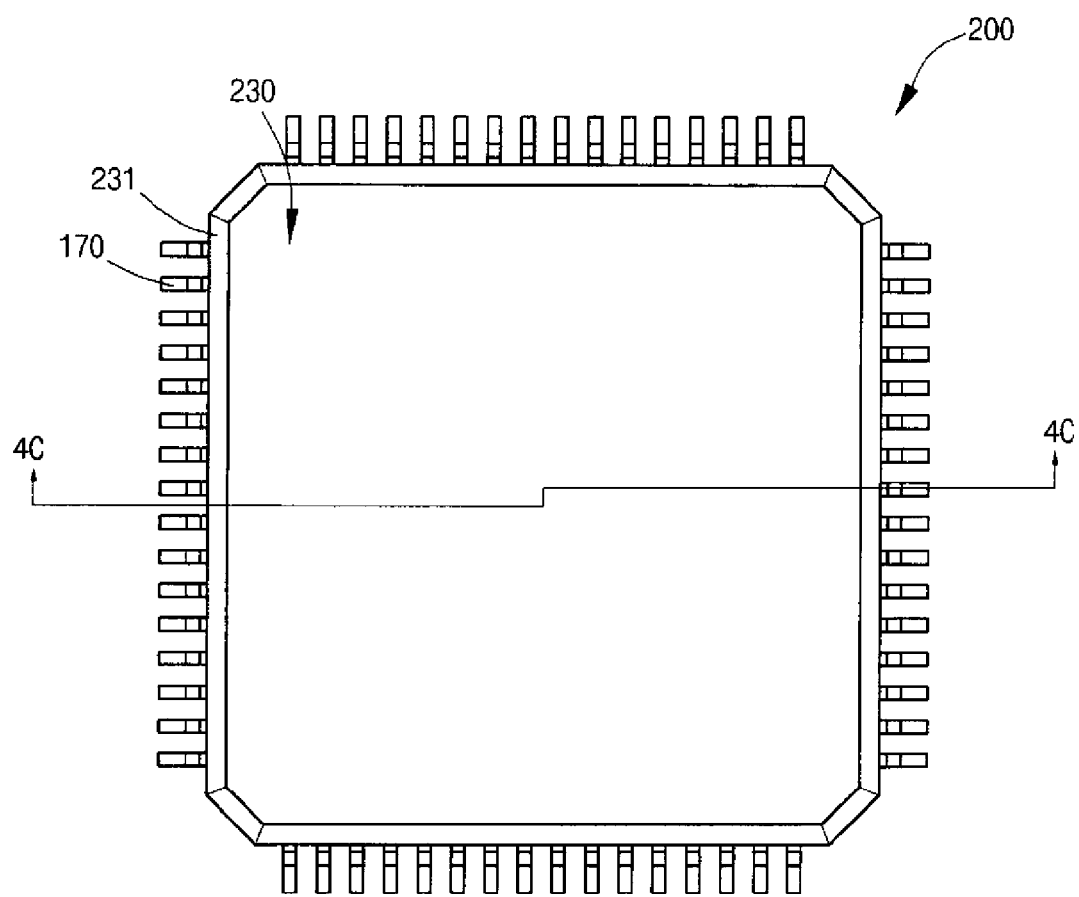
FIG. 4A is a top plan view of a semiconductor package constructed in accordance with the present invention and including the leadframe shown in FIGS. 1A and 1B subsequent to the singulation thereof.
Figure 4B:
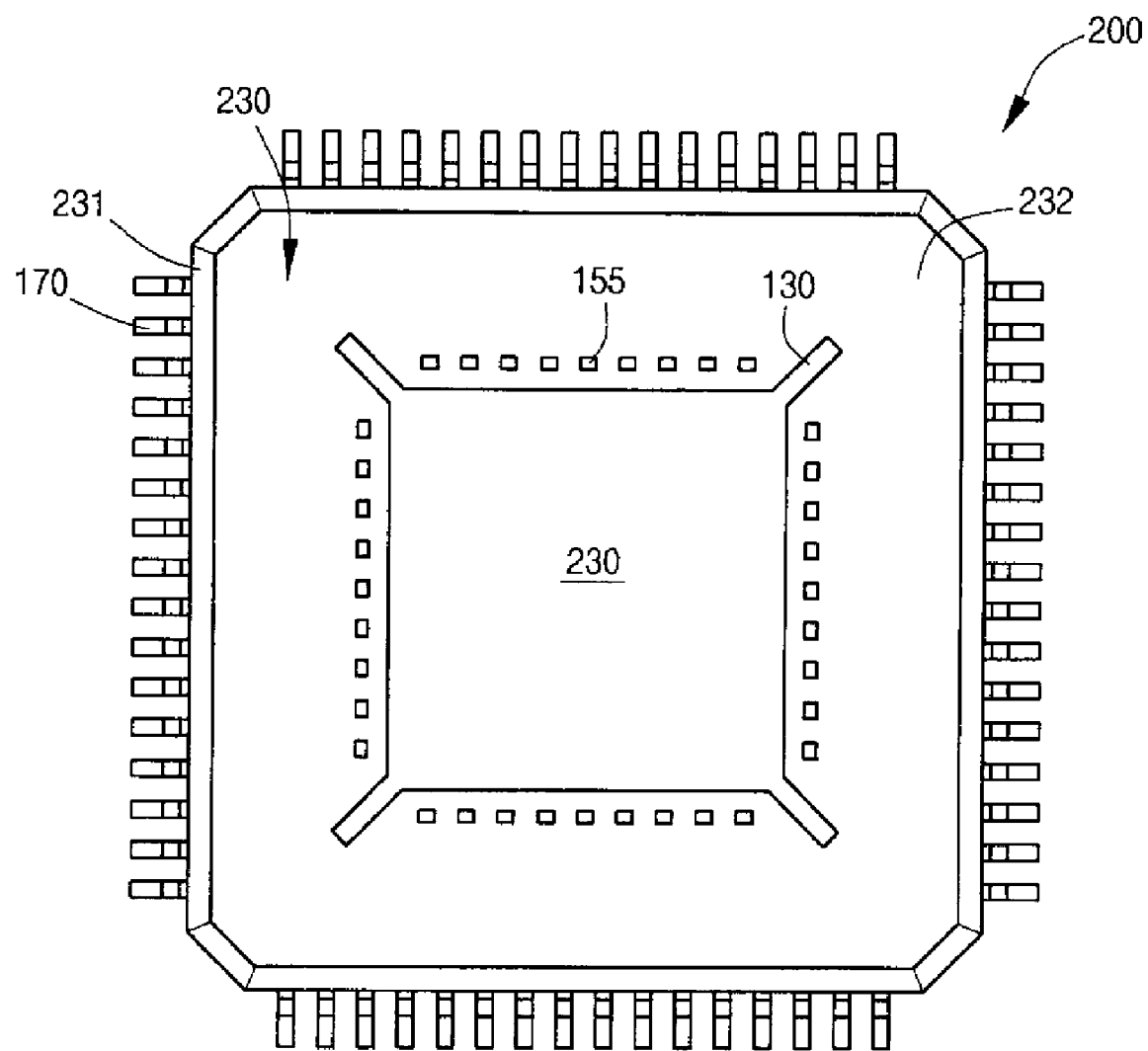
FIG. 4B is a bottom plan view of the semiconductor package shown in FIG. 4A.
Figure 4C:
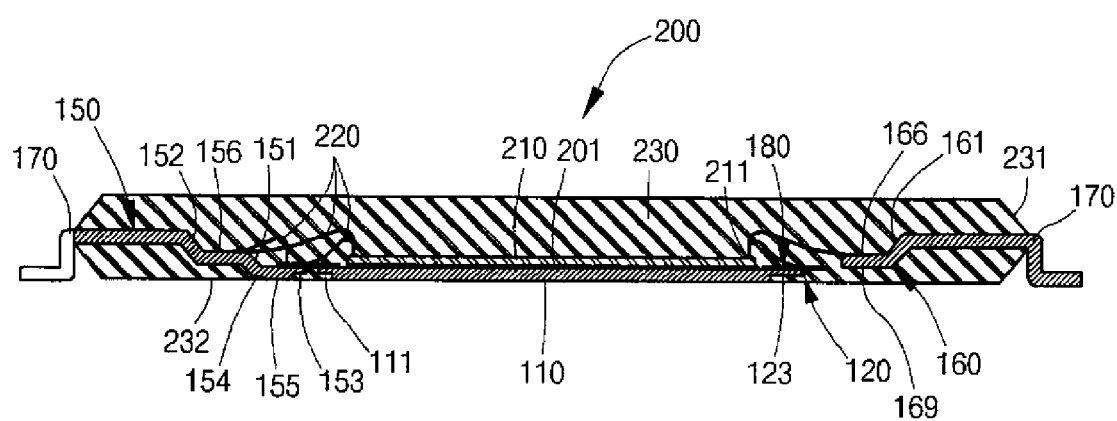
FIG. 4C is a cross-sectional view of the semiconductor package taken along line 4C-4C of FIG. 4A.

As further seen in FIGS. 1A, 1B and 3, the third segment of each of the tie bars 130 may be provided with an opposed pair of integral locking protrusions to assist in the mechanical interlock of the tie bars 130 to the package body of the semiconductor package 200. Additionally, each of the tie bars 130 may include an opposed pair of locking protrusions 134 which are integrally connected to the die pad 110. Each of the locking protrusions 134 includes a half-etched portion 133 which defines the bottom surface thereof. During the fabrication process for the semiconductor package 200 including the leadframe 100, the encapsulant material used to form the package body of the semiconductor package 200 is also able to flow over the half-etched portions 133 of the locking protrusions 134 as well as the third segments including the locking protrusions thereon, thus resulting in portions of the tie bars 130 being encapsulated by the package body of the semiconductor package 200 which improves the bonding or mechanical interlock therebetween. The half-etched portions 133 of the locking protrusions 134 of the tie bars 130 are also indicated by the hatching shown in FIG. 1B.

As indicated above, the tie bars 130 are integrally connected to the dambar 140 which circumvents the die pad 110. In the leadframe 100, the dambar 140 is provided in the form of a substantially quadrangular (e.g., square) ring which interconnects the distal ends of the tie bars 130, thus resulting in the dambar 140 extending in generally coplanar relation to the third segments of the tie bars 130. More particularly, as best seen in FIGS. 1A and 1B, the dambar 140 defines four peripheral segments which extend in spaced, generally parallel relation to respective ones of the peripheral edge segments of the die pad 110. In a fabrication process for the semiconductor package which will be described in more detail below, the dambar 140 is singulated or removed from the leadframe 100 to electrically isolate other structural features of the leadframe 100 from each other.

The leadframe 100 of the semiconductor package 200 further comprises a plurality of first leads 150 which are integrally connected to the dambar 140 and extend inwardly toward the die pad 110. More particularly, the first leads 150 are segregated into four sets, with the first leads 150 of each set being integrally connected to an extending generally perpendicularly from a respective one of the four peripheral segments defined by the dambar 140. The first leads 150 of each set are also arranged at a predetermined pitch and are each of a predetermined length. As is apparent from FIG. 1B, the first leads 150 are not in electrical contact with the die pad 110 or any of the pads 120. Rather, the distal end of each of the first leads 150 is positioned between an adjacent pair of the pads 120 in spaced relation thereto and to the die pad 110, as indicated above.

As seen in FIGS. 1A-3, each of the first leads 150 is bent to include a first downset 151 and a second downset 152. The first downset 151 of each first lead 150 is disposed between the second downset 152 and the die pad 110. Due to the inclusion of the first and second downsets 151, 152 therein, each of the first leads 150 includes a first segment which is disposed between the die pad 110 and the first downset 151 and extends in generally co-planar relation to the die pad 110, a second segment which extends between the first and second downsets 151, 152 and resides on a plane which is elevated above that of the die pad 110, and a third segment which extends between the second downset 152 and the dambar 140 and resides on a plane which is elevated above that of the second segment. Thus, the first, second and third segments of each first lead 150 reside on respective ones of three spaced, generally parallel planes, with the plane upon which the second segment resides being disposed between those planes on which respective ones of the first and third segments reside.

Figure 2A:
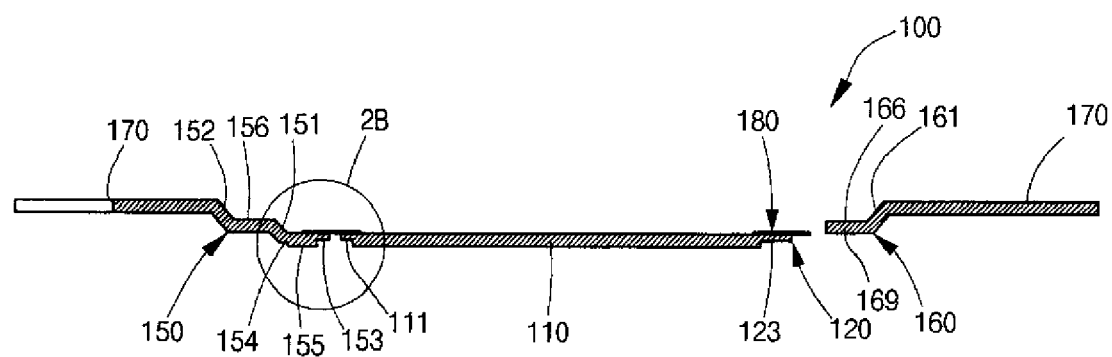
FIG. 2A is a cross-sectional view of the leadframe taken along line 3-3 of FIG. 2.
Figure 2B:
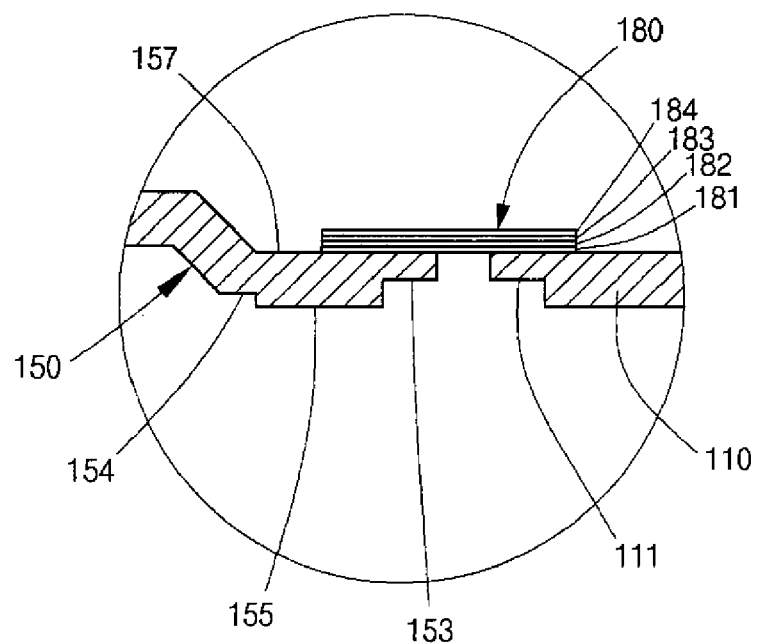
FIG. 2B is an enlargement of the encircled region included in FIG. 2A.

As best seen in FIGS. 2A and 2B, formed in the bottom surface of the first segment of each first lead 150 is a first half-etched portion 153 and a second half-etched portion 154. The first half-etched portion 153 extends to the inner, distal end of the first lead 150 defined by the first segment thereof, and resides between an adjacent pair of the pads 120. The second half-etched portion 154 is disposed in spaced relation to the first half-etched portion 153, and extends to the first downset 151. As a result of the formation of the first and second half-etched portions 153, 154 within the bottom surface of the first segment of each of the first leads 150, the non-etched portion of the bottom surface of the first segment of each first lead 150 defines a generally planar land 155 which extends between the first and second half-etched portions 153, 154. As is most apparent from FIG. 2B, the land 155 defined by each first lead 150 extends in generally coplanar relation to the generally planar bottom surface of the die pad 110 which is circumvented by the half-etched portion 111. Along these lines, the first segment of each first lead 150 further defines a generally planar top surface 157 which extends in generally co-planar relation to the generally planar top surface of the die pad 110. Further, as is also apparent from FIG. 2B, the first half-etched portion 153 of the first segment of each first lead 150 may extend in generally co-planar relation to the half-etched portion 111 of the die pad 110.

In the leadframe 100 of the present invention, it is contemplated that the first and second half-etched portions 153, 154 of each of the first leads 150 can be formed by either half-etching as described above, or alternatively by forging. During the fabrication process for the semiconductor package 200 including the leadframe 100, the encapsulant material used to form the package body of the semiconductor package 200 is able to flow over the first and second half-etched portions 153, 154, thus facilitating a strong mechanical bond or interlock between each of the first leads 150 and the package body despite the land 155 defined by each first lead 150 being exposed in such package body. The first and second half-etched portions 153, 154 of each first lead 150 also serve to prevent insufficient filling or complete separation of the package body in the vicinity of the lands 155, and further serve to fix the first leads 150 within the package body such that the lands 155 do not protrude from the bottom surface of the package body, but rather are substantially flush or continuous therewith as will be described in more detail below.

In addition to defining the land 155, each of the first leads 150 further includes a wire bonding area 156 defined by the top surface of the second segment thereof which, as indicated above, extends between the first and second downsets 151, 152. Thus, as will be recognized, the wire bonding area 156 is situated at a higher level than the die pad 110. As will be discussed in more detail below, the wire bonding area 156 of each of the first leads 150 provides an area for the electrical bonding of conductive wires.

The leadframe 100 constructed in accordance with the present invention further comprises a plurality of second leads 160 which are integrally connected to the dambar 140. Each of the second leads 160 includes an inner portion 169 which extends inwardly from the dambar 140 toward the die pad 110 in spaced relation thereto, and an outer portion 170 which extends outwardly from the dambar 140 away from the die pad 110. The second leads 160, like the first leads 150, are preferably segregated into four sets, with each set of the second leads 160 extending between an adjacent pair of the tie bars 130. The second leads 160 of each set also extend generally perpendicularly relative to a respective one of the peripheral segments of the dambar 140 at a predetermined length, the second leads 160 of each set also being arranged at a predetermined pitch. As is apparent from FIGS. 1A and 1B, certain ones of the second leads 160 of each set have a generally linear configuration, and extend partially between a respective, adjacent pair of the first leads 150 in spaced relation thereto. For those second leads 160 of each set which do not extend between an adjacent pair of the first leads 150, the inner portion 169 thereof preferably has an angled portion so as to be disposed closer to a respective one of the peripheral edge segments of the die pad 110.

In the leadframe 100, the inner portion 169 of each of the second leads 160 which has a generally straight or linear configuration and extends between an adjacent pair of the first leads 150 is preferably bent to include a downset 161. Due to the inclusion of the downset 161 therein, each inner portion 169 includes a first segment which is disposed between the downset 161 and the die pad 110, and a second segment which extends between the downset 161 and the dambar 140. The first segments of the inner portions 169 preferably reside on the same plane as the second segments of the first leads 150. Similarly, the second segments of the inner portions 169 preferably reside on the same plane as the third segments of the first leads 150 and the dambar 140. In this regard, each of the inner portions 169 includes a wire bonding area 166 which is defined by the top surface of the first segment thereof and extends from the downset 161 to the distal end of the inner portion 169 defined by the first segment. The wire bonding areas 166 of the inner portions 169 of the second leads 160 extend in generally co-planar relation to the wire bonding areas 156 of the first leads 150. Like the wire bonding areas 156 of the first leads 150, the wire bonding areas 166 of the inner portions 169 of the second leads 160 provide areas for the electrical bonding of conductive wires, as will be described in more detail below. In the leadframe 100, it is contemplated that for ease of wire bonding, gold or silver may be plated on the wire bonding areas 156, 166. Alternatively, the leadframe 100 may a pre-plated leadframe (PPF) to provide enhance wire bonding areas.

In the leadframe 100, the outer portions 170 of the second leads 160, the dambar 140, the second segments of the inner portions 169 of the second leads 160, and the third segments of the first leads 150 all reside on a common plane. In the process of fabricating the semiconductor package 200 as will be described in more detail below, the dambar 140 is ultimately singulated in a manner wherein the second leads 160 are electrically isolated from each other. The singulation of the dambar 140 also occurs in a manner wherein the first leads 150 are electrically isolated from each other, and from the second leads 160.

The leadframe 100 of the semiconductor package 200 may be fabricated from a conventional metal material, such as copper, copper alloy, steel plated with copper, or a functional equivalent. However, those of ordinary skill in the art will recognize that the present invention is not limited to any particular material for the leadframe 100. Additionally, the number of pads 120, first leads 150 and second leads 160 shown in FIGS. 1A and 1B is for illustrative purposes only, and may be modified according to application field. Along these lines, the pads 120, first leads 150 and second leads 160 may have designs or configurations varying from those shown in FIGS. 1A-3 without departing from the spirit and scope of the present invention. Additionally, though the pads 120, first leads 150 and second leads 160 are each shown as each being segregated into four sets, it will be recognized that fewer sets of the pads 120, first leads 150 and second leads 160 may be provided, and may be arranged along any combination of two or three of the peripheral sides of the die pad 110. Moreover, less than four tie bars 130 may be included in the leadframe 100, extending to respective corners of the die pad 110 in any combination. It is further contemplated that the leadframe 100 may be fabricated through the implementation of a chemical etching process or alternatively a mechanical stamping process.

As seen in FIGS. 1A, 2A and 2B, it is contemplated that the leadframe 100 constructed in accordance with the present invention may include a tape layer 180 which is adhered to the top surfaces of the pads 120 and to the top surfaces 157 of the first segments of the first leads 150. In addition to being attached to the top surfaces of the pads 120 and the top surfaces 157 of the first segments of the first leads 150, the tape layer 180 may also be adhered to a peripheral portion of the top surface of the die pad 110. It will also be appreciated that the tape layer 180 can also optionally be adhered to the top surfaces of the tie bars 130. The tape layer 180 is an optional element of the leadframe 100 and the semiconductor package 200 fabricated to include the same. Additionally, the shape of the tape layer 180 shown in FIG. 1A is exemplary only, in that the tape layer 180 may consist of separate segments rather than a continuous quadrangular frame as depicted.

The tape layer 180, if included in the leadframe 100, is used to prevent the first leads 150 from undergoing any deformation or variation in position during the fabrication process related to the semiconductor package 200. If included in the leadframe 100, it is contemplated that the tape layer 180 will have a multi-layer structure. More particularly, as seen in FIG. 2B, it is contemplated that the tape layer 180 will include an adhesive layer 181, an insulating layer 182, a metal layer 183 and a plating layer 184. The adhesive layer 181 is adhered to the peripheral portion of the top surface of the die pad 110, the top surfaces of the pads 120, the top surfaces of the first segments of the tie bars 130, and the top surfaces 157 of the first segments of the first leads 150. The insulating layer 182 is formed on the adhesive layer 181 and may comprise a polyimide or an equivalent thereto. The metal layer 183 is formed on the insulating layer 182 and may be fabricated from a highly conductive copper material or an equivalent thereto. The plating layer 184 is formed on the metal layer 183, and may comprise gold, silver, nickel, palladium, or a PPF plating layer. The tape layer 180 having the metal layer 183 and the plating layer 184 is preferably provided in the form of a ring, and may be combined with regions related to power supply or ground. This combination enables efficient arrangement of the first leads 150 and the second leads 160. Those of ordinary skill in the art will recognize that the tape layer 180 may be configured to exclude the metal layer 180 and the plating layer 184. In this case, the tape layer 180 would serve only to prevent the first leads 150 from being deformed during the fabrication process for the semiconductor package 200 including the leadframe 100, as indicated above.

Referring now to FIGS. 4A-4C, the semiconductor package 200 as fabricated to include the leadframe 100 is shown in detail. As will be recognized by those of ordinary skill in the art, in the completed semiconductor package shown in FIGS. 4A-4C, the dambar 140 is singulated or removed from the leadframe 100 to facilitate the electrical isolation of the various structural features of the leadframe 100 from each other. More particularly, the dambar 140 is singulated in a manner wherein the second leads 160 are electrically isolated from each other. The singulation of the dambar 140 also occurs in a manner wherein the first leads 150 are electrically isolated from each other, and from the second leads.

In the semiconductor package 200, a semiconductor die 210 is attached to the top surface of the die pad 110 through the use of an adhesive layer or an adhesive tape 201. The semiconductor die 210 includes a plurality of bond pads 211 which are disposed on the top surface thereof opposite the bottom surface adhered to the adhesive tape 201. The bond pads 211 are used to deliver and receive electrical signals.

The semiconductor package 200 further comprises a plurality of conductive wires 220 which are used to electrically connect the bond pads 211 of the semiconductor die 210 to respective ones of the first leads 150 and the second leads 160. The conductive wires 220 may be fabricated from aluminum, copper, gold, silver, or a functional equivalent. However, those of ordinary skill in the art will recognize that the present invention is not limited to any particular material for the wires 220. If the tape layer 180 is included with the leadframe 100 and ultimately included in the semiconductor package 200, the conductive wires 220 may also be used to electrically connect the bond pads 211 of the semiconductor die 210 to the plating layer 184 of the tape layer 180 and to electrically connect the plating layer 184 to one or more of the first leads 150 and/or one or more of the second leads 160. Thus, the tape layer 180 having the plating layer 184 serves to combine power supply or ground signals if included in the semiconductor package 200. One or more conductive wires 220 may also be used to electrically connect one or more bond pads 211 of the semiconductor die 210 directly to the die pad 110. In this regard, though not shown, the peripheral edge portion of the top surface or the entire top surface of the die pad 110 may be plated and bonded with conductive wires 220, allowing for the use of the plated die pad 110 as a ground region.

In the semiconductor package 200, in electrically connecting the bond pads 211 to the first leads 150, it is contemplated that the conductive wires 220 will be extended from the bond pads 211 to the wire bonding areas 156 defined by the second segments of respective ones of the first leads 150. However, in the event that the tape layer 180 is not included with the leadframe 100 and thus not included in the semiconductor package 200, it is contemplated that the electrical connection of the bond pads 211 of the semiconductor die 210 to the first leads 150 may be facilitated by extending the conductive wires 220 between the bond pads 211 and the top surfaces 157 of the first segments of respective ones of the first leads 150. The electrical connection of the bond pads 211 of the semiconductor die 210 to the second leads 160 is preferably facilitated by extending the conductive wires 220 from the bond pads 211 to the wire bonding areas 166 defined by the first segments of respective ones of the inner portions 169 of the second leads 160. Since the wire bonding areas 156 of the first leads 150 extend in generally co-planar relation to the wire bonding areas 166 of the inner portions 169 of the second leads 160, the conductive wires 220 can be bonded to the wire bonding areas 156, 166 by repeatedly reciprocating capillaries at the same height to maintain constant wiring bonding quality.

In the semiconductor package 200, the die pad 110, the pads 120, the tie bars 130, the first leads 150, the second leads 160, the semiconductor die 210 and the conductive wires 220 are at least partially encapsulated or covered by an encapsulant material which, upon hardening, forms the package body 230 of the semiconductor package 200. More particularly, the package body 230 covers the entirety of the die pad 210 except for the bottom surface thereof which is circumvented by the half-etched portion 111. The package body 230 also covers the entirety of each of the first leads 150 except for the land 155 defined thereby and a small portion of the third segment thereof. The package body 230 also covers the entirety of each of the inner portions 169 of the second leads 160 except for a small portion of the second segment thereof. The entirety of each of the tie bars 130 is also covered by the package body 230, except for the bottom surface of the first segment of each tie bar 130 which extends in generally co-planar relation to the bottom surface of the die pad 110 and the lands 155 defined by the first leads 150. The outer portions 170 of the second leads 160 of the leadframe 100 are not covered by the package body 230. The dambar 140 is also not covered by the package body 230 so that it may be removed from the leadframe 100.

Since, in the completed package body 230, the pads 120 are completely covered by the package body 230, increased bonding is achieved between the die pad 110 and the package body 230, with the pads 120 also improving heat sink performance. Additionally, since the first and second half-etched portions 153, 154 of each of the first leads 150 are positioned within the package body 230, increased bonding strength is achieved between the first leads 150 and the package body 230. Further, the inclusion of the first and second half-etched portions 153, 154 in each of the first leads 150 makes it difficult for the encapsulant material used to form the package body 230 to reach the lands 155 during the process of forming the package body 230. As a result, no flashing typically occurs on the lands 155. Without the second half-etched portions 154 within the first leads 150, the interfacial regions between the first downsets 151 and the lands 155 would be rounded, which could result in the encapsulant material covering the lands 155 to a considerable extent along the rounded surfaces, thus potentially making the shape of the exposed portions of the lands 155 irregular or causing the lands 155 to be buried by the package body 230. Since the second half-etched portions 154 are formed as steps between the first downsets 151 and the lands 155 in the first leads 150, it is difficult for the encapsulant material used to form the package body 230 to reach the lands 155 via the second half-etched portions 154, which makes the shape of the exposed lands 155 uniform (e.g., substantially quadrangular). However, those of ordinary skill in the art will recognize that the lands 155 may have shapes other than for a quadrangular shape, e.g., oval, circular.

Due to the structural attributes of the fully formed package body 230, the generally planar bottom surface of the die pad 110 is exposed in and substantially flush with the generally planar bottom surface 232 of the package body 230, as are the generally planar bottom surfaces of the first segments of the tie bars 130. Similarly, the generally planar land 155 defined by each first lead 150 is exposed in and substantially flush with the bottom surface 232 of the package body 230. The outer portions 170 of the second leads 160 of each set thereof protrude laterally outward from respective side surfaces 231 of the package body 230. As seen in FIGS. 4A-4C, the exposed outer portions 170 may be bent to assume a gull-winged configuration to allow the same to be electrically connected to an underlying substrate such as a printed circuit board. As indicated above, in order to complete the fabrication of the semiconductor package 200 to allow the same to assume the configuration shown in FIGS. 4A-4C, the dambar 140 must be removed from the leadframe 100 to facilitate the electrical isolation of the first leads 150 and the second leads 160 from each other as explained above. In this regard, it is contemplated that a conventionally known debarring process may be implemented to remove the dambar 140. The completion of such debarring process results in each of the first leads 150 defining an outer, distal end which is exposed in and substantially flush with a respective side surface 231 defined by the package body 230.

In the semiconductor package 200, the wire bonding areas 156, 166 to which the conductive wires 220 are extended can prevent sweeping and shorting of the conductive wires 220 arising from the flow of the encapsulant material during the process of forming the package body 230. Additionally, as explained above, the tape layer 180 is intended to prevent the first leads 150 from undergoing any deformation or variation in position during the fabrication process related to the semiconductor package 200, including the formation of the package body 230 thereof. As also previously explained, the tape layer 180, if included in the leadframe 100, is adhered to the top surfaces of the pads 120, the top surfaces 157 of the first segments of the first leads 150, the peripheral portion of the top surface of the die pad 110, and the top surfaces of the first segments of the tie bars 130. During the process of fabricating the semiconductor package 200, the pads 120 serve to inhibit the deformation of the tape layer 180 in vertical and horizontal directions which could otherwise result from the shrinkage and expansion of the tape layer 180. The inhibition of the deformation of the tape layer 180 in turn inhibits variations in the positions of the first leads 150. In this regard, the first leads 150 may be moved in slight increments in horizontal and/or vertical directions due to the shrinkage and expansion of the tape layer 180 during the process of fabricating the semiconductor package 200. The pads 120 serve to reduce the shrinkage and expansion of the tape layer 180 so that the flatness of the lands 155 of the first leads 150 can be substantially maintained during the fabrication process. The flatness of the lands 155 is a very important factor. More particularly, if the flatness of the lands 155 is not uniform, a large amount of flash may occur on the lands 155 during the process of fabricating the package body 230. The flash would impede the mounting of the completed semiconductor package 200 to an underlying substrate, and thus would require the completion of an added deflashing step to mechanically or chemically remove the flash. In addition to supporting the tape layer 180, the pads 120 further play a role in improving the heat sink performance of the die pad 110 in the completed semiconductor package 200.

As indicated above, the outer portions 170 of the second leads 160 are exposed in the semiconductor package 200, as are the lands 155 defined by the first leads 150. As a result, the lands 155 are capable of being mounted to the surface of an underlying substrate such as a printed circuit board through the use of, for example, a soldering technique. Electrical signals are routed between the lands 155 and the semiconductor die 210 by the corresponding first leads 150 and conductive wires 220. Similarly, electrical signals may be routed from the semiconductor die 210 to the outer portions 170 by the corresponding inner portions 169 and conductive wires 220. Like the lands 155, the outer portions 170 of the second leads 160 may be surface mounted to an underlying substrate such as a printed circuit board through the use of, for example, a soldering technique. Since the leadframe 100 of the semiconductor package 200 is configured to provide the outer portions 170 of the second leads 160 which protrude from the side surfaces 231 of the package body 230 and the lands 155 which are exposed in the bottom surface 232 of the package body 230, the number of I/O's in the leadframe 100 increases in proportion to the number of the second leads 160 and the lands 155.

Figure 5:
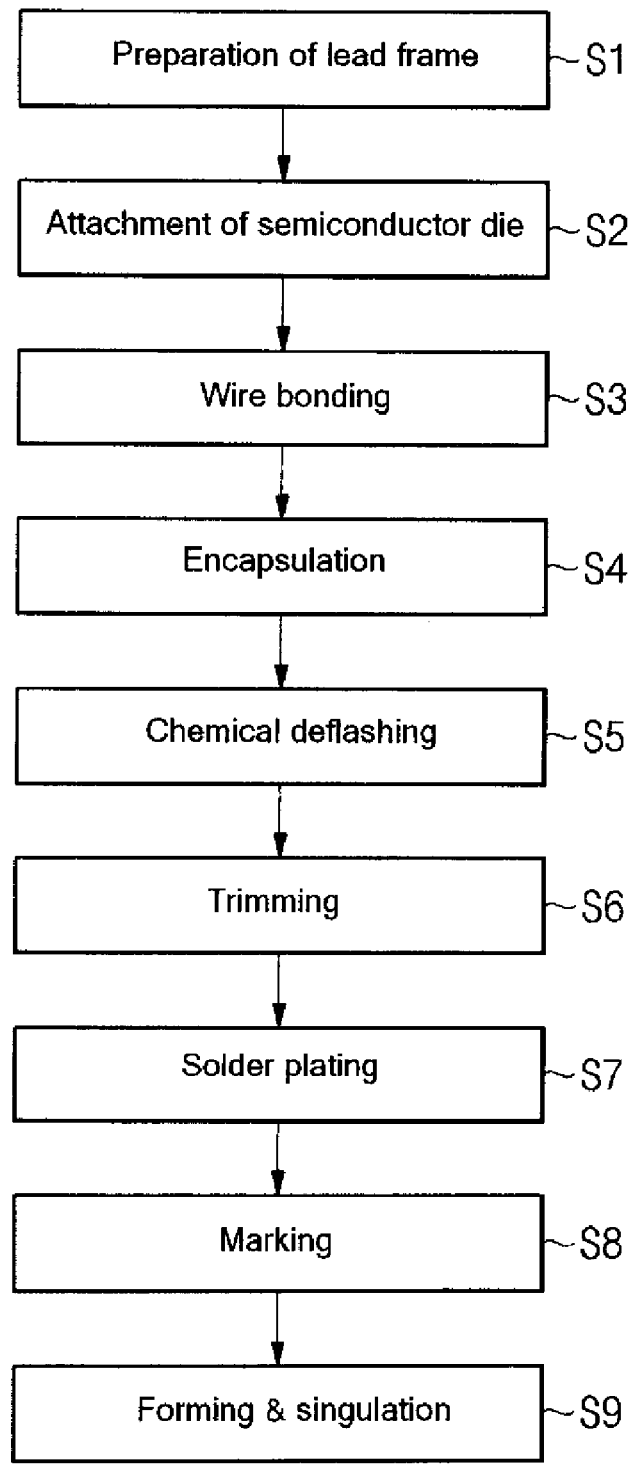
FIG. 5 is a flow chart illustrating an exemplary fabrication method for the semiconductor package shown in FIGS. 4A-4C.

Referring now to FIG. 5, there is provided a flow chart which sets forth an exemplary method for fabricating the semiconductor package 200 of the present invention. The method comprises the steps of preparing the leadframe (S1), semiconductor die attachment (S2), wire bonding (S3), encapsulation (S4), chemical deflashing (S5), trimming (S6), solder plating (S7), marking (S8), and forming and singulation (S9). FIGS. 6A-6I provide illustrations corresponding to these particular steps, as will be discussed in more detail below.

Figure 6A:
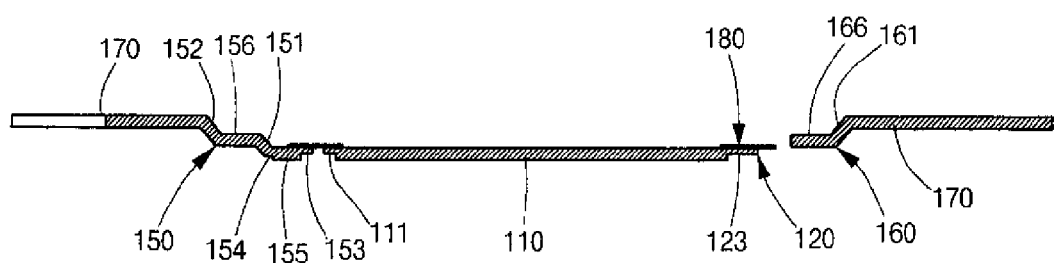
FIGS. 6A-6I are views illustrating an exemplary fabrication method for the semiconductor package shown in FIGS. 4A-4C.
Figure 6B:
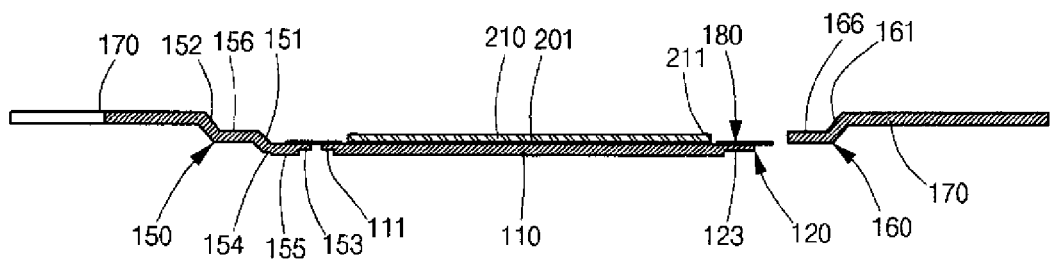

Referring now to FIG. 6A, in the initial step S1 of the fabrication process for the semiconductor package 200, the leadframe 100 having the above-described structural attributes is provided. Thereafter, as illustrated in FIG. 6B, step S2 is completed wherein the semiconductor die 210 having the bond pads 211 is attached to the top surface of the die pad 110 of the leadframe 100 through the use of the adhesive layer 201. As indicated above, the adhesive layer 201 can be selected from well known liquid epoxy adhesives, adhesive films and adhesive tapes, as well as equivalents thereto.

Figure 6C:
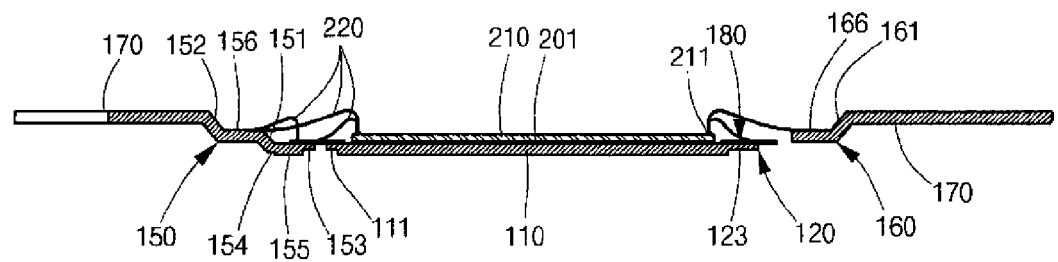
Figure 6D:
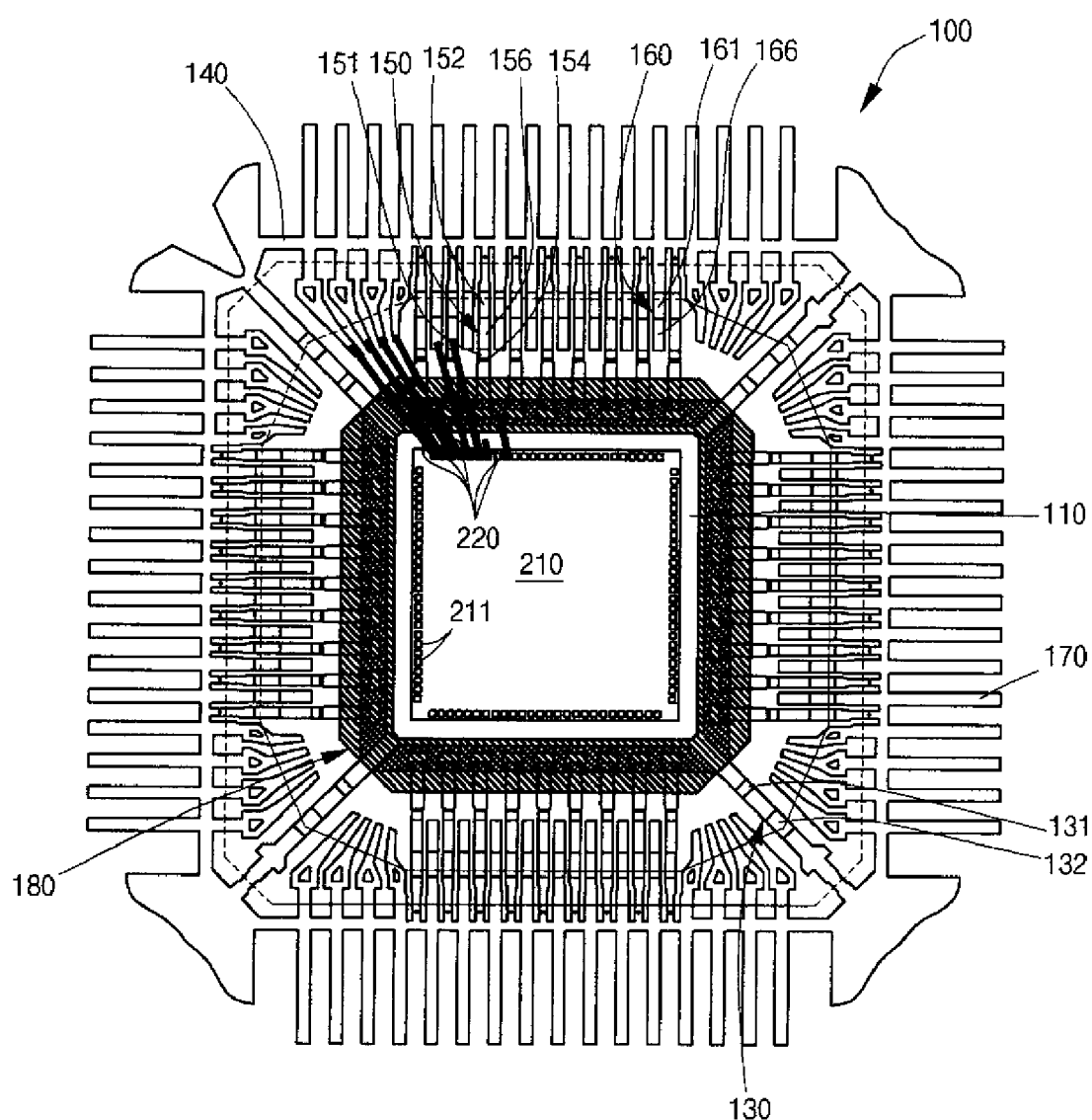

Referring now to FIGS. 6C and 6D, in the next step S3 of the fabrication process, the conductive wires 220 are used to electrically interconnect the semiconductor die 210 to the leadframe 100 in the aforementioned manner. Specifically, the bond pads 211 of the semiconductor die 210 are electrically connected to the first leads 150 and the second leads 160. As also shown in FIGS. 6C and 6D, conductive wires 220 are also used to electrically connect the bond pads 211 of the semiconductor die 210 to the plating layer 184 of the tape; layer 180, and to electrically connect the plating layer 184 to at least one of the first leads 150.

Figure 6E:
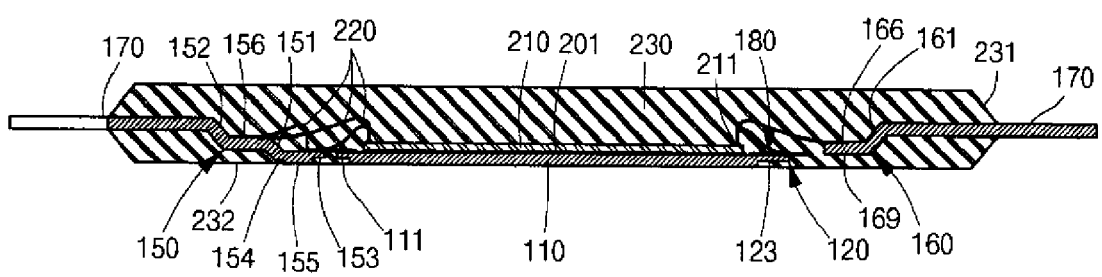
Figure 6F:
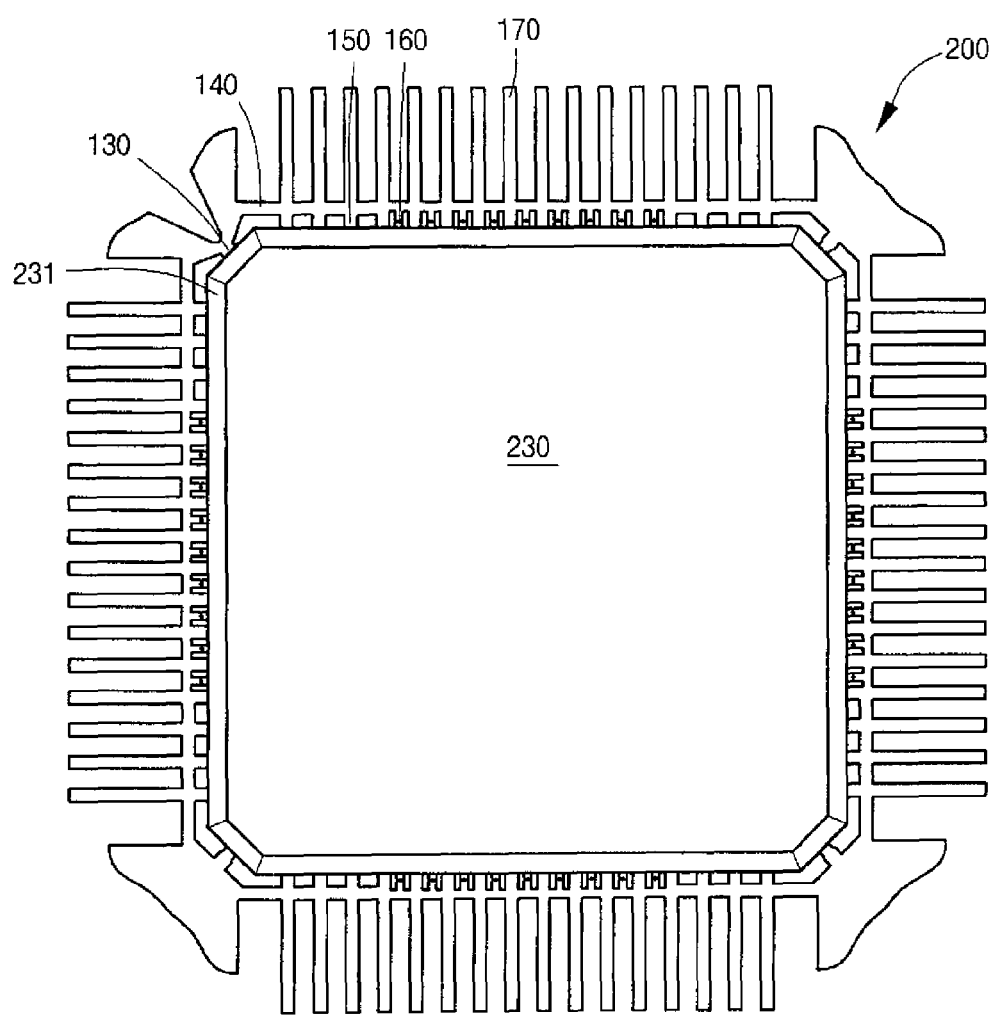

Referring now to FIGS. 6E and 6F, in the next step S4 of the fabrication process for the semiconductor package 200, portions of the leadframe 100, the tape layer 180, the semiconductor die 210 and the conductive wires 220 are encapsulated with an encapsulant material which, upon hardening, forms the package body 230 of the semiconductor package 200. More particularly, the package body 230 covers the entirety of the die pad 210 except for the bottom surface thereof which is circumvented by the half-etched portion 111. The package body 230 also covers the entirety of each of the first leads 150 except for the land 155 defined thereby and a small portion of the third segment thereof. The package body 230 also covers the entirety of each of the inner portion 169 of each of the second leads 160 except for a small portion of the second segment thereof. The entirety of each of the tie bars 130 is also covered by the package body 230, except for the bottom surface of the first segment of each tie bar 130 which extends in generally co-planar relation to the bottom surface of the die pad 110 and the lands 155 defined by the first leads 150. The outer portions 170 of the second leads 160 of the leadframe 100 are not covered by the package body 230. The dambar 140 is also not covered by the package body 230 so that it may be removed from the leadframe 100. Subsequent to the formation of the package body 230 in step S4, chemical deflashing (step S5) may be performed if films of flash (a resin component of the encapsulant material) are formed on the bottom surface of the die pad 110 and upon the lands 155. If such thin films of flash are present as could impede the ability to mount the semiconductor package 200 to an underlying substrate, the removal of such flash films by a chemical etching method is required.

Figure 6G:
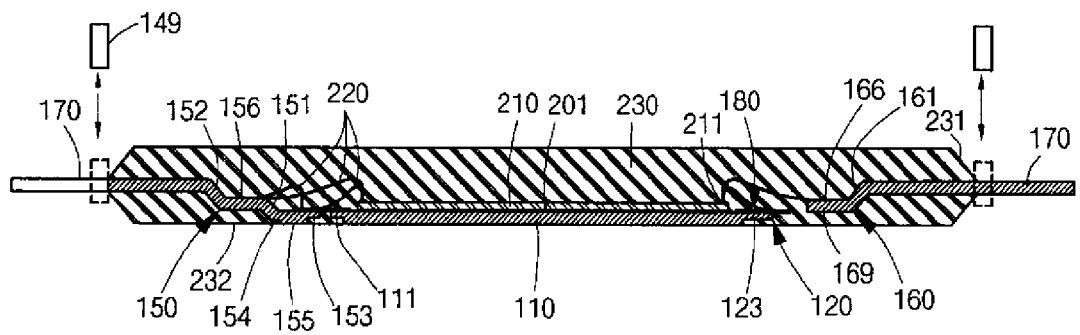
Figure 6H:
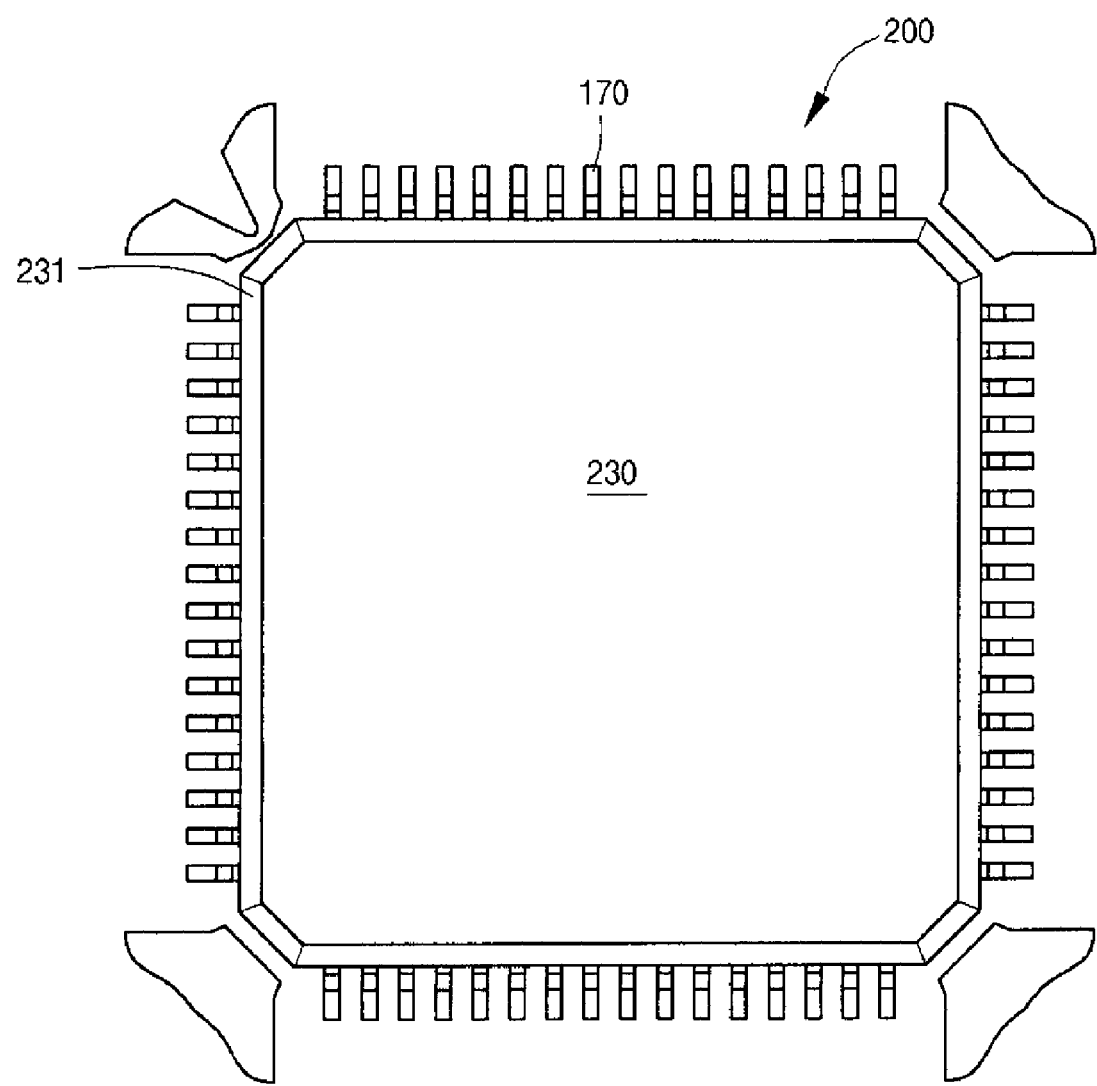

Referring now to FIGS. 6G and 6H, in the next step S6 of the fabrication process for the semiconductor package 200, the dambar 140 is trimmed or removed by cutting so that the first leads 150 and the second leads 160 are electrically isolated from each other in the above described manner. As previously explained, the dambar 140 is positioned outside of the package body 230 to allow for the removal thereof from the leadframe 100, and is removed by cutting the same with dambar cutting tools 149. In addition, as also previously described, portions of the first leads 150 protruding from the side surfaces 231 of the package body 230 are also completely removed during the trimming process.

Upon the completion of step S6, a solder plating step (step S7) may also be performed in the fabrication process for the semiconductor package 200. More particularly, after the dambar 140 and portions of the first leads 150 have been removed using the dambar cutting tools 149, some metal areas of the leadframe 100 susceptible to oxidation are exposed to air. Since the leadframe 100 is typically made of copper, the same is susceptible to oxidation. In order to prevent the oxidation of the exposed metal areas of the leadframe 100, all elements (e.g. the first leads 150) of the leadframe 100 exposed outside of the encapsulant 230 may be plated by soldering. Subsequent to the completion of any such solder plating step (step S7), a marking step (step S8) may be performed upon the semiconductor package 200. More particularly, ink or a laser may be used to mark the product name, the manufacturer of the semiconductor package 200, etc. on a prescribed surface of the package body 230.

Figure 6I:
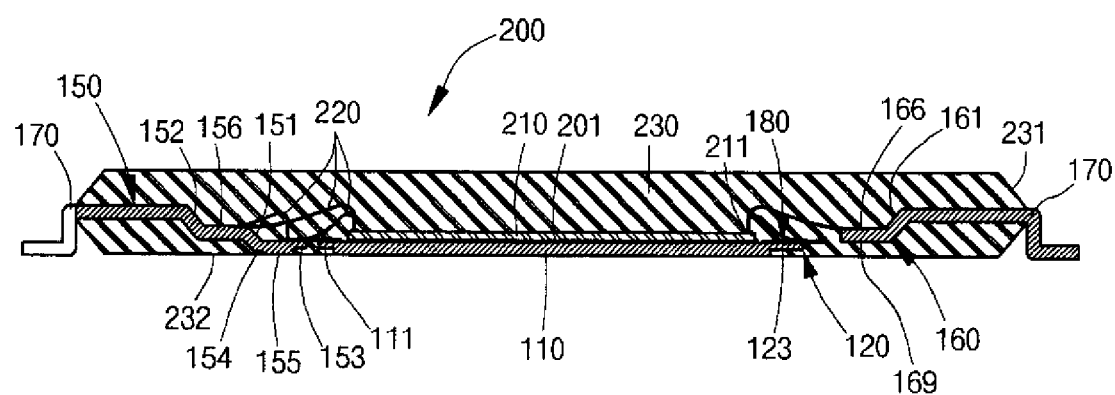

Referring now to FIG. 6I, in the next step S9 of the fabrication process for the semiconductor package 200, the outer portions 170 of the second leads 160 protruding from the package body 230 are formed in appropriate shapes. Specifically, the outer portions 170 protruding from the side surfaces 231 of the package body 230 may be formed into predetermined shapes using a lead forming tool (not shown) to allow the semiconductor package 200 to have a shape suitable for mounting to an external unit or an underlying substrate. Although the outer portions 170 of the second leads 160 are depicted as being formed outwardly relative to the package body 230 in FIG. 6I, those of ordinary skill in the art will recognize that the outer portions 170 can alternatively be formed downwardly and inwardly relative to the package body 230. Thereafter, portions of the tie bars 130 protruding outwardly from the package body 230 are cut to separate the semiconductor package 200 from the leadframe 100.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A semiconductor package comprising:
a generally planar die pad defining multiple peripheral edge segments;
a plurality of first leads which each include first and second downsets formed therein in spaced relation to each other, the first leads being segregated into at least two sets which extend along respective ones of at least two peripheral edge segments of the die pad;
a plurality of second leads, at least some of which include a downset formed therein, the second leads being segregated into at least two sets which extend along respective ones of at least two peripheral edge segments of the die pad;
a conductive tape layer attached to at least some of the first leads;
a semiconductor die attached to the die pad and electrically connected to at least one of each of the first and second leads, and to the tape layer;
a package body defining a generally planar bottom surface and multiple side surfaces, the package body at least partially encapsulating the first and second leads, the tape layer, and the semiconductor die such that the first and second downsets of the first leads, the downsets of the second leads, and the tape layer are covered by the package body, at least portions of the die pad and the first leads are exposed in and substantially flush with the bottom surface of the package body, and portions of the second leads protrude from at least one of the side surfaces of the package body.

2. The semiconductor package of claim 1 wherein the die pad has a generally quadrangular configuration, and the first and second leads are segregated into at least four sets which each extend along a respective one of the peripheral edge segments of the die pad.

3. The semiconductor package of claim 2 wherein the semiconductor die is electrically connected to the first and second leads and the tape layer by conductive wires which are covered by the package body.

4. The semiconductor package of claim 3 wherein:
each of the first leads includes a first segment, a second segment defining a wire bond zone, and a third segment, the first segment being disposed between the first downset and the die pad and defining a land which is exposed in the bottom surface of the package body, the first downset extending between the first and second segments, and the second downset extending between the second and third segments;
each of the second leads has inner and outer portions, the inner portion of each of the second leads including a first segment which defines a wire bond zone, and a second segment, the downset of each of the second leads extending between the first and second segments thereof;
the tape layer is attached to the first segments of at least some of the first leads; and
the conductive wires extend from the semiconductor die to respective ones of the wire bond zones of the first and second leads, and to the tape layer.

5. The semiconductor package of claim 4 wherein the first segment of each of the first leads includes a top surface, a bottom surface which defines the land, a first surface which is recessed relative to the bottom surface and covered by the package body, and a second surface which is recessed relative to the bottom surface and covered by the package body, the land being disposed between the first and second surfaces, with the tape layer being attached to the top surfaces of at least some of the first segments.

6. The semiconductor package of claim 4 wherein the die pad further includes a plurality of pads integrally connected to and extending perpendicularly from at least one of the peripheral edge segments thereof, the tape layer further being attached to at least some of the pads.

7. The semiconductor package of claim 6 wherein:
the die pad defines opposed, generally planar top and bottom surfaces;
each of the pads has a top surface which extends in generally coplanar relation to the top surface of the die pad and a bottom surface which is recessed relative to the bottom surface of the die pad;
each of the pads is covered by the package body; and
the tape layer is attached to the top surfaces of at least some of the pads and a peripheral portion of the top surface of the die pad.

8. The semiconductor package of claim 7 wherein the die pad includes a first surface which is recessed relative to the bottom surface thereof and is generally coplanar with the bottom surfaces of the pads, the first surface of the die pad being covered by the package body.

9. The semiconductor package of claim 7 wherein the pads are segregated into at least four sets which extend from respective ones of the peripheral edge segments of the die pad.

10. The semiconductor package of claim 9 wherein a portion of the first segment of each of the first leads is disposed between an adjacent pair of the pads.

11. The semiconductor package of claim 6 wherein:
the die pad, the pads, and the first segments of the first leads extend along a first plane;
the wire bond zones of the first and second leads each extend along a second plane which is disposed in spaced, generally parallel relation to the first plane; and
the third segments of the first leads, the second segments of the inner portions of the second leads, and the outer portions of the second leads each extend along a third plane which is disposed in spaced, generally parallel relation to the second plane such that the second plane extends between the first and third planes.

12. The semiconductor package of claim 1 wherein the tape layer comprises:
an adhesive layer attached to at least some of the first leads;
an insulating layer disposed on the adhesive layer;
a metal layer disposed on the insulating layer: and
a plating layer disposed on the metal layer, the semiconductor die being electrically connected to the plating layer.

13. A semiconductor package comprising:
a die pad;
a plurality of pads integrally connected to and extending from the die pad;
a plurality of first leads which each include first and second downsets formed therein in spaced relation to each other, the first leads extending along the die pad;
a plurality of second leads, at least some of which include a downset formed therein, the second leads extending along the die pad;
a conductive tape layer attached to at least some of the first leads and at least some of the pads;
a semiconductor die attached to the die pad and electrically connected to at least one of each of the first and second leads, and to the tape layer; and
a package body defining a bottom surface and a side surface, the package body at least partially encapsulating the pads, the first and second leads, the tape layer, and the semiconductor die such that the pads, the first and second downsets of the first leads, the downsets of the second leads, and the tape layer are covered by the package body, at least portions of the first leads are exposed in the bottom surface of the package body, and portions of the second leads protrude from the side surface of the package body.

14. The semiconductor package of claim 13 wherein:
each of the first leads includes a first segment, a second segment which defines a wire bond zone, and a third segment, the first segment being disposed between the first downset and the die pad and defining a land which is exposed in the bottom surface of the package body, the first downset extending between the first and second segments, and the second downset extending between the second and third segments;
each of the second leads has inner and outer portions, the inner portion of each of the second leads including a first segment which defines a wire bond zone, and a second segment, the downset of each of the second leads extending between the first and second segments thereof;
the tape layer is attached to the first segments of at least some of the first leads; and
the conductive wires extend from the semiconductor die to respective ones of the wire bond zones of the first and second leads, and to the tape layer.

15. The semiconductor package of claim 14 wherein the first segment of each of the first leads includes a top surface, a bottom surface which defines the land, a first surface which is recessed relative to the bottom surface and covered by the package body, and a second surface which is recessed relative to the bottom surface and covered by the package body, the land being disposed between the first and second surfaces, with the tape layer being attached to the top surfaces of at least some of the first segments.

16. The semiconductor package of claim 14 wherein:
the die pad defines opposed, generally planar top and bottom surfaces;
each of the pads has a top surface which extends in generally coplanar relation to the top surface of the die pad and a bottom surface which is recessed relative to the bottom surface of the die pad; and
the tape layer is attached to the top surfaces of at least some of the pads and a peripheral portion of the top surface of the die pad.

17. The semiconductor package of claim 16 wherein the die pad includes a first surface which is recessed relative to the bottom surface thereof and is generally coplanar with the bottom surfaces of the pads, the first surface of the die pad being covered by the package body.

18. The semiconductor package of claim 14 wherein a portion of the first segment of each of the first leads is disposed between an adjacent pair of the pads.

19. The semiconductor package of claim 13 wherein the tape layer comprises:
an adhesive layer attached to at least some of the first leads;
an insulating layer disposed on the adhesive layer;
a metal layer disposed on the insulating layer: and
a plating layer disposed on the metal layer, the semiconductor die being electrically connected to the plating layer.

20. A semiconductor package comprising:
a die pad;
a plurality of pads integrally connected to and extending from the die pad;
a plurality of first leads which each include first and second downsets formed therein and define a wire bond zone between the first and second downsets, the first leads extending along the die pad;

a plurality of second leads, at least some of which include a downset formed therein, the second leads extending along the die pad, with at least some of the second leads defining a wire bond zone between the downset thereof and the die pad;

a semiconductor die attached to the die pad and electrically connected to at least one of each of the first and second leads; and a package body defining a bottom surface, the package body at least partially encapsulating the pads, the first and second leads, and the semiconductor die such that the pads, the first and second downsets of the first leads and the downsets of the second leads are covered by the package body, at least portions of the die pad and the first leads are exposed in the bottom surface of the package body, and portions of the second leads are exposed in the package body.

\* \* \* \* \*